(12) United States Patent
Whitehouse et al.

(10) Patent No.: US 12,253,543 B1
(45) Date of Patent: Mar. 18, 2025

(54) PLUG-IN ENERGY SENSOR

(71) Applicant: Amazon Technologies, Inc., Seattle, WA (US)

(72) Inventors: Cameron Dean Whitehouse, Seattle, WA (US); Matthew Liang Chaboud, San Francisco, CA (US); Joseph A. Cullen, Issaquah, WA (US); Arielle Rachel Bertman, Seattle, WA (US)

(73) Assignee: Amazon Technologies, Inc., Seattle, WA (US)

( * ) Notice: Subject to any disclaimer, the term of this patent is extended or adjusted under 35 U.S.C. 154(b) by 419 days.

(21) Appl. No.: 16/021,735

(22) Filed: Jun. 28, 2018

(51) Int. Cl.
G01R 15/12 (2006.01)
G01R 21/00 (2006.01)
H01R 13/66 (2006.01)

(52) U.S. Cl.
CPC ............ *G01R 15/12* (2013.01); *G01R 21/00* (2013.01); *H01R 13/6683* (2013.01)

(58) Field of Classification Search
CPC ..... G01R 21/00; G01R 15/12; H01R 13/6683
See application file for complete search history.

(56) References Cited

U.S. PATENT DOCUMENTS

| 6,700,333 | B1 | 3/2004 | Hirshi et al. |
| 7,959,136 | B2 | 6/2011 | Nordmeyer |
| 8,131,497 | B2 | 3/2012 | Steinberg et al. |
| 8,244,405 | B2 | 8/2012 | Kao et al. |
| 8,423,322 | B2 | 4/2013 | Steinberg et al. |
| 8,498,753 | B2 | 7/2013 | Steinberg et al. |
| 9,146,548 | B2 | 9/2015 | Chambers et al. |
| 10,018,371 | B2 | 7/2018 | Steinberg et al. |

(Continued)

FOREIGN PATENT DOCUMENTS

WO 2010103332 A1 9/2010

OTHER PUBLICATIONS

Blackford, J., "The Future of Computing: For 500,000 Years Technology has Advanced While People Remained the Same. In the next Millennium, the Human Race Plays Catch-Up," Computer Shopper, 19(12) 319, retrieved from https://dialog.proquest.com/professional/docview/668855858?accountid=142257, 1999.

(Continued)

*Primary Examiner* — Christopher E Mahoney
(74) *Attorney, Agent, or Firm* — Athorus. PLLC

(57) ABSTRACT

Described implementations monitor potential voltage at a location to determine device usage at the location. The implementations utilize a plug-in energy sensor that is plugged directly into any electrical outlet at the location and measures deviation in voltage at the location. Once plugged into an electrical outlet, the plug-in energy sensor monitors one or more of the lead line and ground, the neutral line and ground, and/or the ground line with respect to a reference for changes in potential voltage at the location. Different devices and different device states of those devices generate different signatures of voltage as they operate, thereby making the signatures unique, or almost unique, to different device types, different devices, and/or different device states. By monitoring for signatures in the voltage, operation of devices in different device states at the location can be determined, along with start times and stop times of those states associated with the various devices.

26 Claims, 15 Drawing Sheets

(56) References Cited

U.S. PATENT DOCUMENTS

| | | |
|---|---|---|
| 10,031,501 B2 | 7/2018 | Chapman |
| 10,107,855 B1 | 10/2018 | Corbett et al. |
| 10,373,234 B2 | 8/2019 | Depew |
| 11,126,244 B1 | 9/2021 | Whitehouse et al. |
| 11,133,817 B1 | 9/2021 | Boettcher et al. |
| 2006/0075249 A1 | 4/2006 | Hayes |
| 2006/0151529 A1 | 7/2006 | Crisp |
| 2006/0227026 A1 | 10/2006 | Kadota |
| 2007/0038402 A1 | 2/2007 | Zhang |
| 2007/0057680 A1 | 3/2007 | Jones et al. |
| 2009/0222148 A1 | 9/2009 | Knotts et al. |
| 2009/0230950 A1* | 9/2009 | Czarnecki ............ H01R 25/003 324/142 |
| 2010/0079132 A1 | 4/2010 | Steele et al. |
| 2010/0164768 A1 | 7/2010 | Mitikiri et al. |
| 2012/0271576 A1 | 10/2012 | Kamel et al. |
| 2012/0302092 A1* | 11/2012 | Kaps .................... H01R 25/006 439/535 |
| 2013/0041605 A1 | 2/2013 | Ting et al. |
| 2013/0127248 A1 | 5/2013 | Lai |
| 2013/0132008 A1* | 5/2013 | Borean ................. G06F 17/00 702/60 |
| 2013/0254151 A1 | 9/2013 | Mohagheghi et al. |
| 2013/0275066 A1 | 10/2013 | Spanier et al. |
| 2014/0035368 A1 | 2/2014 | Adams |
| 2014/0136348 A1 | 5/2014 | Carroll et al. |
| 2014/0177737 A1 | 6/2014 | Vasquez et al. |
| 2014/0225603 A1 | 8/2014 | Auguste et al. |
| 2014/0333322 A1* | 11/2014 | Kabler ................. G01D 4/008 324/511 |
| 2014/0354266 A1 | 12/2014 | Hurwitz et al. |
| 2015/0039391 A1* | 2/2015 | Hershkovitz .......... G06Q 50/30 705/7.31 |
| 2015/0057825 A1 | 2/2015 | Steele et al. |
| 2015/0077243 A1 | 3/2015 | Hooper et al. |
| 2015/0185262 A1 | 7/2015 | Song et al. |
| 2015/0253364 A1* | 9/2015 | Hieda ..................... H04Q 9/00 702/62 |
| 2016/0018447 A1 | 1/2016 | Nys et al. |
| 2016/0047848 A1 | 2/2016 | Chang et al. |
| 2016/0132032 A1 | 5/2016 | Bruneel et al. |
| 2016/0248436 A1 | 8/2016 | Watanabe |
| 2016/0274168 A1 | 9/2016 | Cabot et al. |
| 2016/0285872 A1 | 9/2016 | Polar et al. |
| 2018/0055409 A1 | 3/2018 | Xu |
| 2018/0080970 A1* | 3/2018 | Kraus ................. G01R 22/068 |
| 2020/0003659 A1* | 1/2020 | Davies ................. G06N 3/084 |
| 2020/0149981 A1* | 5/2020 | Koeppl ................ G01K 7/023 |
| 2021/0333310 A1 | 10/2021 | Nag et al. |

OTHER PUBLICATIONS

International Search Report and Written Opinion dated Sep. 8, 2015 for International Application No. PCT/US2015/036018, 11 pages.
P3 International, "Kill A Watt," P3 International Corporation, Copyright 2014 http://www.p3international.com/products/p4400.html (downloaded Jun. 27, 2014, byweb.archive.org), 1 page.
Ian, "Dangerous DSO part 3: Messing with the front-end," Dangerous Prototypes, www.dangerousprotoype.com, May 11, 2011; URL: http://dangerousprototypes.com/blog/2011/05/11/dangerous-dso-part-3-messing-with-the-front-end/; retrieved Feb. 23, 2022.

* cited by examiner

PLUG-IN ENERGY SENSOR

BACKGROUND

People typically use power supplied from power systems, provided using power grids, to light buildings, to heat and cool homes, to enable operation of devices (computers, televisions, kitchen appliances, etc.). There is a price for power.

As homes and other locations become more autonomous and more connected, attempts have been made to monitor and/or control the amount of energy consumed by various devices at those locations. However, existing monitoring systems require direct installation into the electrical panel of the location and/or direct connection to a service main at the location. In addition, many require dedicated breaker panels for operation.

BRIEF DESCRIPTION OF DRAWINGS

The detailed description is described with reference to the accompanying figures.

DETAILED DESCRIPTION

Figure 1:
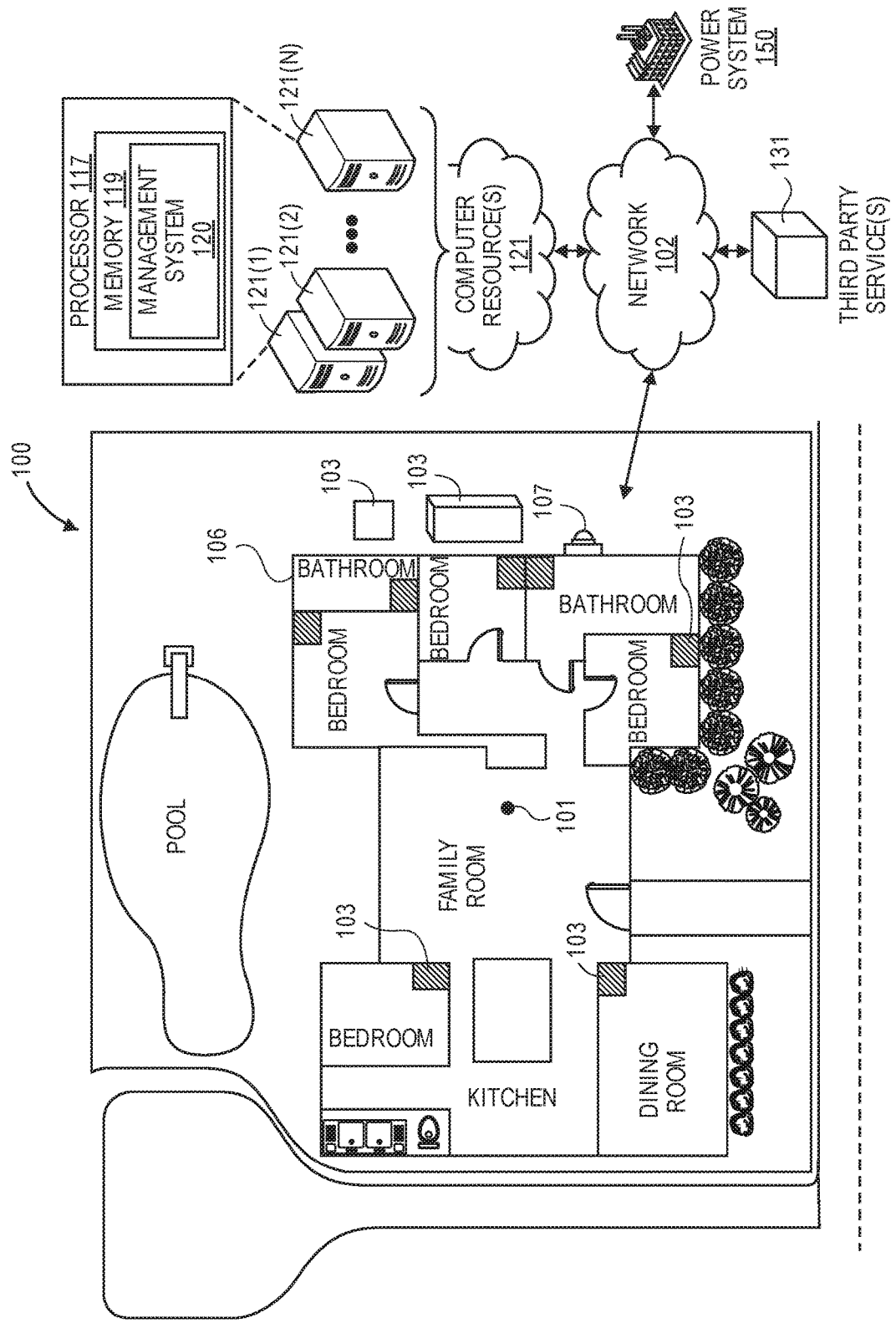
FIG. 1 is a block diagram of a location for which energy consumption is to be monitored and/or reduced, in accordance with described implementations.

Described are systems, methods, and apparatus that monitor potential voltage at a location to determine device usage at the location. In comparison to existing systems that require installation into a breaker panel or directly to the mains to measure current, the disclosed implementations utilize a plug-in energy sensor that may be plugged directly into any electrical outlet at the location and measure deviation in voltage at the location. Once plugged into an electrical outlet, the plug-in energy sensor monitors one or more of the positive line and ground and/or the neutral line and ground for changes in potential voltage at the location. For example, when a device at the location is turned on, the device generates voltage that is introduced into the voltage signal at the location and detectable by the plug-in energy sensor. Different devices generate different patterns or signatures of voltage as they operate, also referred to herein as signature data, thereby making the signatures unique, or almost unique, to different device types and/or different devices. For example, the voltage pattern (signature data) introduced by operation of a microwave is very different than the signature of a washing machine. By monitoring for signature data in the voltage, operation of devices at the location can be determined, along with start times and stop times of those operations associated with the various devices.

In some implementations, the signature data, determined device, or determined device type, state of the device (or the start time and stop time indicating changes in device state) may be compared with energy consumption data for the location to determine the energy consumed by the device during that state of the device. For example, the energy consumption data between the start time and the stop time of a device state may be processed to determine an increase in energy consumption during that period of time. The increase may then be attributed to the state of operation of the device. In some implementations, the energy consumption data may also be used as an input to assist in determining the device. As discussed below, the energy consumption data may be obtained from the power company, from one or more power meters and/or service equipment at the location, etc.

In some implementations, information from other devices at the location may also be used to determine the operating state of a device. For example, some devices may communicate with the plug-in energy sensor and/or other devices within the location and provide information indicating whether the current state of the device. Likewise, a home control system, such as a communication hub, may control the operation of one or more devices at the location. In still other examples, sensors, such as light sensors and/or motion sensors at the location may be used to provide information relating to potential human presence, device operation, identification of persons at the location, rooms within the location that are occupied, etc. Information from such devices may be utilized as additional inputs to determine the device state or device states of multiple devices at the location.

Utilizing voltage monitoring from a plug-in energy sensor that can be incorporated into the electrical system by simply plugging the plug-in energy sensor into any electrical outlet in conjunction with energy consumption data for the location provides an improvement over existing energy monitoring systems. For example, the disclosed implementations may be installed by any consumer and do not require professional installation, connection directly to the breaker box and/or electrical mains, and do not consume one or more breaker slots on the breaker box panel. Still further, by monitoring for changes in voltage, rather than or in addition to current, additional information and data may be obtained for devices at the location.

In some implementations, the signature data determined by the plug-in energy sensor, along with the start time and stop time corresponding to each detected signature and respective state of the device, is provided to a remote computing system, referred to herein as a management system. The management system maintains location profiles for each location, user profiles for users at or associated with the various locations, and may also receive third party data, such as energy consumption information for the location, weather patterns, power system load, expected energy consumption information for devices, device signals, etc. The location profiles may identify characteristics about each location, identification of devices at the location, signature data for those devices and/or different states for those devices, the size of a structure at the location, identification of users that occupy the location, the orientation of the location, the altitude of the location, etc.

In some implementations, the management system may process the signature data to identify the device and/or the device state of a device that generated the signature data. In other implementations, device identification may be done by the plug-in energy sensor. In still other implementations, the plug-in energy sensor may store signature data for previously identified devices at the location and, if a detected signature matches one of the stored signature data, the plug-in energy sensor may identify the device and/or the device state of the device. However, if a detected signature does not match a stored signature, the detected signature may be transmitted from the plug-in energy sensor to the remote management system for additional analysis. The remote management system may compare the received signature data with a larger data set of signature data to determine a device type, a device of the device type, and/or a device state of the device. Once identified, the signature data and the device identification and/or device state identification may be provided to the plug-in energy sensor and used in the future by the plug-in energy sensor to identify the device and/or the device state.

In still other examples, the plug-in energy sensor and/or the remote management system may determine whether an identified device is consuming an expected amount of energy, or whether it may be malfunctioning and/or need servicing—for example, if the device is consuming more energy than expected, and/or if the device is introducing an unexpected voltage or signal on the ground line at the location. Alternatively, or in addition thereto, the actual energy consumed by a device of a device type may be compared with energy consumption of alternative devices of that device type to determine a savings or return on investment that could be realized by replacing an existing device of a device type, with another, more efficient device of that device type.

In still other examples, the plug-in energy sensor and/or the remote management system may determine alternative times during which device operation may be performed at a lower cost, due to, for example, lower energy costs from the power company during those periods of time. In such an example, one or more recommended energy saving actions may be presented to individuals at the location recommending alternative times at which one or more devices could be operated to reduce the cost of energy consumed at the location. In other examples, device operation may be autonomously adjusted.

FIG. 1 is a block diagram of a location 100 for which energy consumption is to be monitored, in accordance with described implementations. In this example, the location is a home location that includes a structure 106 in the form of a personal residence. It will be appreciated that the location and corresponding structure may be any location or structure for which energy consumption is to be monitored and/or managed with the described implementations. For example, the location may be residential, business, commercial, public, etc. Likewise, the structure may be a personal residence, apartment, office building, government building, municipal building, entertainment facility (e.g., coliseum, stadium), shopping facility, etc.

One or more plug-in energy sensors 101 may be positioned at the location by simply plugging in the plug-in energy sensor into any electrical outlet at the location 100. In some implementations, two plug-in energy sensors 101 may be utilized at the location, one monitoring each phase of a two-phase power supply at the location. In other implementations, only a single plug-in energy sensor may be utilized. Additional details about an example plug-in energy sensor are discussed further below with respect to FIG. 11.

Likewise, each location includes one or more devices 103 that consume variable amounts of energy based on their usage. The devices 103 may be internal or inside the structure 106, or external or outside the structure 106, and may provide various functions. In some implementations, the devices may be configured to communicate with a communication component to either receive operation instructions and/or to provide usage information.

As discussed herein, upon installation, the plug-in energy sensor monitors for voltage changes at the location and, extracts from a baseline voltage for the location, detected voltage changes. For example, a location in the United States may receive 120 volts at 60 Hertz ("Hz") frequency, which represents a baseline that is known for the plug-in energy sensor. The plug-in energy sensor may then monitor for voltage changes at the location by periodically subtracting the baseline from actual voltage measurements at the location. The remaining voltage is representative of changes at the location and, over a period of time, the determined voltage changes represent signature data for a device that is operating during that period of time and/or a device state for the device.

The plug-in energy sensor 101, in some implementations, may also introduce a known load, such a resistive load, an inductive load, or a capacitive load, into the existing circuit at the location and monitor for changes as a result of the introduced load. Load introduction may be performed when the plug-in energy sensor is first connected to the circuit to aid in determining the topology and/or characteristics of the circuit at the location. Likewise, if there is more than one plug-in energy sensor at the location, a code may be transmitted by a first plug-in energy sensor that is detectable by the second plug-in energy sensor and utilized to determine if the two plug-in energy sensors are on the same phase of the circuit at the location. For example, if the code is detected by the second plug-in energy sensor, it may be determined that the two plug-in energy sensors are on the same phase. If the code is not detected, it may be determined that the two plug-in energy sensors are on different phases of the circuit.

Still further, a first plug-in energy sensor may introduce a load into the circuit that is detectable by the second plug-in energy sensor and utilized to determine if the two plug-in energy sensors are on the same branch of the circuit at the location. For example, if there is little to no attenuation or impedance change between the signal produced in response to the introduced load as measured at the first plug-in energy sensor and measured at the second plug-in energy sensor, it may be determined that both plug-in energy sensors are on the same circuit branch. In comparison, if there is a measurable attenuation or impedance change, it may be determined that the two plug-in energy sensors are on different branches of the electrical circuit at the location.

If it is determined that both plug-in energy sensors are on the same phase and/or same branch of the circuit, a user may be notified and requested to move one of the plug-in energy sensors to a different location, such as a different electrical outlet at the location, in an effort to position both plug-in energy sensors on different phases and/or branches of the electrical circuit. By having a plug-in energy sensor on each phase of the circuit and/or on different branches, better detection of devices at the location may be available in comparison to a single plug-in energy sensor or having multiple plug-in energy sensors on the same phase and/or branch of the circuit.

As signature data is collected by the plug-in energy sensor, the signature data may be used by the plug-in energy sensor to identify a device that generated the signature data and/or to determine the state of the device that generated the signature data. In addition, or as an alternative thereto, the signature data may be provided to the management system 120 via a network 102, such as the Internet.

The location may also include a power meter 103 that measures the amount of energy consumed at the location. In some implementations, the power meter 103 may include a wireless component that transmits energy consumption data at periodic intervals and/or that may be polled and, in response to a poll, provide energy consumption data. In such an implementation, the energy consumption data may be obtained locally from the power meter 103 by the plug-in energy sensor and/or by another component at the location (e.g., communication hub) and used to determine the amount of energy consumed by a device during operation of that device or during a particular operating state of the device.

The system may also include computing resource(s) 121. The computing resource(s) 121 are remote from the location 100. Likewise, the computing resource(s) 121 may be configured to communicate over a network 102 with the location 100, the plug-in energy sensor 101, and/or the devices 103. Likewise, the computing resource(s) 121 may communicate over the network 102 with one or more power systems 150, and/or one or more third party service(s) 131.

As illustrated, the computing resource(s) 121 may be implemented as one or more servers 121(1), 121(2), . . . , 121(N) and may, in some instances, form a portion of a network-accessible computing platform implemented as a computing infrastructure of processors, storage, software, data access, and so forth that is maintained and accessible by components/devices of the system via a network 102, such as an intranet (e.g., local area network), the Internet, etc. The computing resources 121 may process signature data received from plug-in energy sensor 101, data from third parties 131 and/or data from the power system 150 to determine devices in operation at the location and/or energy consumed by those devices when operating at the location 100.

The server system(s) 121 does not require end-agent knowledge of the physical location and configuration of the system that delivers the services. Common expressions associated for these remote computing resource(s) 121 include "on-demand computing," "software as a service (SaaS)," "platform computing," "network-accessible platform," "cloud services," "data centers," and so forth. Each of the servers 121(1)-(N) include a processor 117 and memory 119, which may store or otherwise have access to a management system 120, as described herein.

The network 102, and each of the other networks discussed herein, may utilize wired technologies (e.g., wires, USB, fiber optic cable, etc.), wireless technologies (e.g., radio frequency, infrared, NFC, cellular, satellite, Bluetooth, etc.), or other connection technologies. The network 102 is representative of any type of communication network, including data and/or voice network, and may be implemented using wired infrastructure (e.g., cable, CAT5, fiber optic cable, etc.), a wireless infrastructure (e.g., RF, cellular, microwave, satellite, Bluetooth, etc.), and/or other connection technologies.

Figure 2:
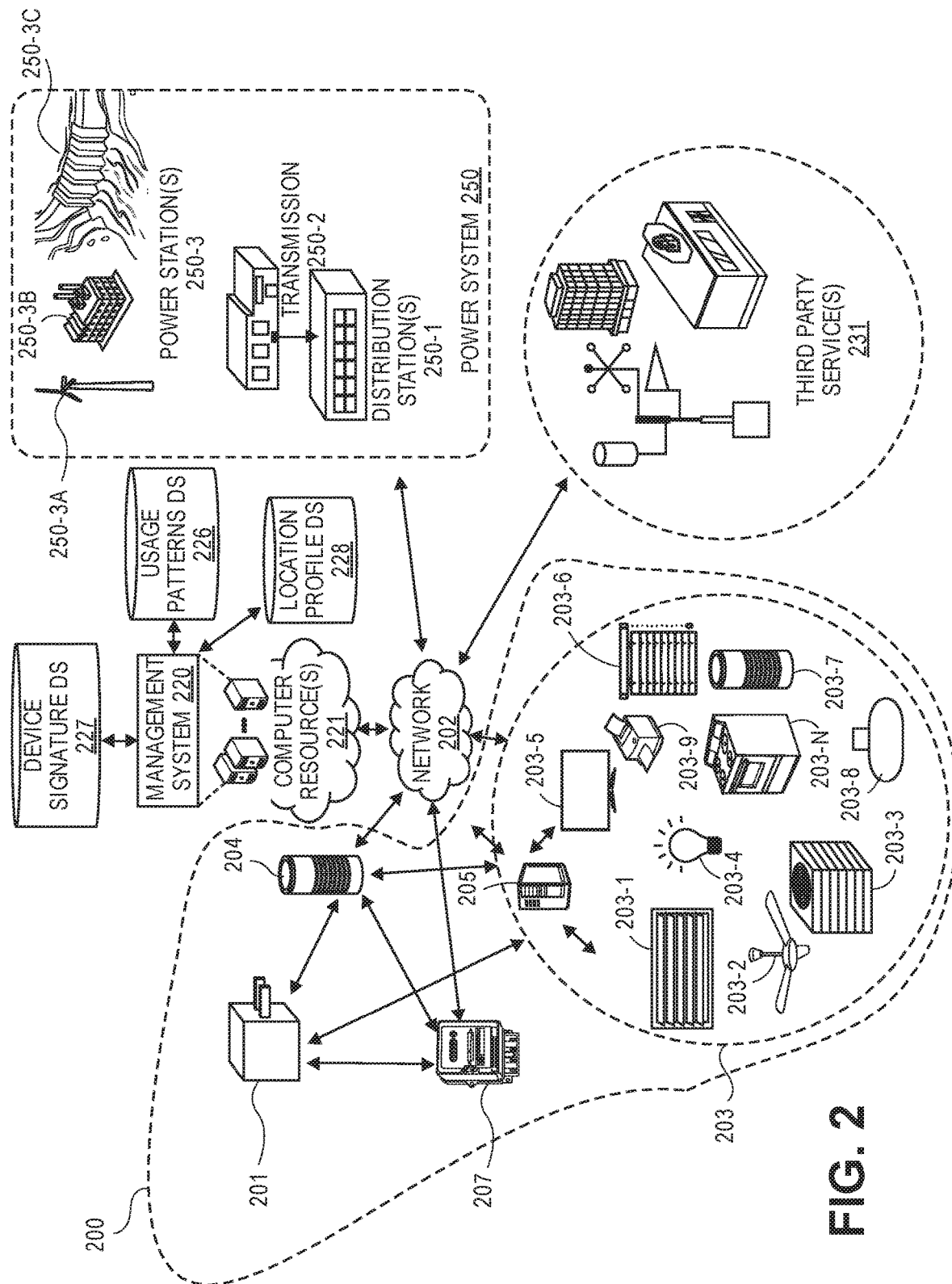
FIG. 2 illustrates a plug-in energy sensor and devices of the location illustrated in FIG. 1 and the communication paths with remote systems and services, in accordance with described implementations.

FIG. 2 illustrates additional details of a plug-in energy sensor 201, devices 203, third party systems 231, and the power system 250 illustrated in FIG. 1 and the communication paths therebetween, in accordance with described implementations. Example hardware configurations of the plug-in energy sensor 201 are discussed further below with respect to FIG. 11. In some implementations, the plug-in energy sensor 201 may be a stand-alone device that may be plugged into any electrical outlet at the location. In other examples, the plug-in energy sensor 201 may be incorporated into a device 203 and/or included as part of a communication component 204.

The plug-in energy sensor 201 may by powered by the electrical system at the location, by battery power, and/or powered from other devices or components. For example, the plug-in energy sensor 201 may harvest power from the electrical outlet into which it is installed.

In addition to collecting signature data, the plug-in energy sensor 201 may be configured to communicate with devices 203, a power meter 207 at the location, and/or a communication component 204 that is also positioned within the location. For example, the plug-in energy sensor 201 may include a wireless transmitter/receiver that is operable to connect to a wireless network 202 and provide determined signature data to other devices and/or the communication component via the wireless network. In other implementations, the plug-in energy sensor 201 may be configured to transmit data, such as detected signature data, start time and/or stop time of device state changes, and/or device identifiers, to other components, such as the communication component 204 via the electrical circuit at the location.

Any form of wired and/or wireless communication may be utilized to facilitate communication between the devices and/or sensors. For example, any one or more of 802.15.4 (ZIGBEE), 802.11 (WI-FI), 802.16 (WiMAX), BLUETOOTH, Z-WAVE, near field communication ("NFC"), etc., may be used to communicate between the devices and one or more sensors.

Devices 203 at a location may include any one or more items that consume energy during operation. Devices may include, but are not limited to adjustable vents 203-1, ceiling fans 203-2, HVAC 203-3, lights 203-4, televisions 203-5, window blinds 203-6, pool pumps or heaters 203-7, hot water heaters 203-8, office equipment, such as computers or printers 203-9, kitchen appliances 203-N (e.g., microwave, stove, refrigerator, freezer), etc. In some implementations, the devices may be connected devices capable of receiving instructions, referred to herein as command data, from the management system 220, via a communication hub 205, via the communication component 204, and/or directly. In other implementations, one or more devices may not be connected and may only be controllable by either a user at the location and/or by controlling the circuit that provides power to the device.

Connected devices 203 are configured to receive and execute instructions included in command data sent from the management system 220 operating on a remote computing resource directly, via the hub 205 that is positioned at the location, and/or via the communication component that is positioned at the location. Likewise, in some implementations, the devices may be further configured to transmit or send operational information (e.g., energy consumption, errors, etc.) to the management system, the plug-in energy sensor, and/or the communication component 204.

In some implementations, the communication hub 205 may forward signature data received from the plug-in energy sensor 201 to the management system for processing by the management system 220 and/or forward command data received from the management system 220 to various devices 203 for execution. In other implementations, some or all of the processing of the signature data may be performed by the communication hub 205. For example, the communication hub 205 may receive signature data from the plug-in energy sensor 201 and compare the signature data with stored signature data representative of devices and/or device states of devices at the location to determine the device and/or the device state of a device that was operating and that generated the signature data. In other implementations, the communication hub 205 may receive voltage data from the plug-in energy sensor, process the data to determine the signature data, and then utilize the signature data to determine the operating device and/or the state of the operating device. In still other examples, voltage data may be sent to the remote management system and the remote management system may process the voltage data to determine the signature data, devices, device state, etc.

While the described implementation discusses a communication hub 205 and a communication component 204 as distinct components, in some implementations, the operation and functions described herein may be performed entirely by one or both of the communication hub 205 or the communication component 204. Accordingly, the use of the terms communication hub 205 and communication component 204 may, in some implementations, be utilized interchangeably.

Regardless of whether signature data is determined at the plug-in energy sensor 201, the communication hub 205, the remote computing system 221, and/or some combination thereof, based on the signature data, a device type, a specific device, and/or a device state of a device may be identified. For example, as discussed further below, the plug-in energy sensor 201 and/or the communication hub 205 at the location may maintain in a memory, stored signature data corresponding to devices, device types, and/or device states of devices known to be at the location. When signature data is detected by the plug-in energy sensor 201, the plug-in energy sensor and/or communication hub may compare the determined signature data with the stored signature data to determine if the signature data corresponds to a known device, device type, and/or device state of a device known to be at the location. If a match is found, the plug-in energy sensor may transmit to the communication hub 205 and/or the remote management system 220, a device identifier for the device or device type and/or a device state identifier for a state of the device, along with a start time and a stop time of the device state, indicating a start and stop or change in state of the device 203, as determined from the signature data detected in the voltage data. Device state may be any state or detectable change in a device. A device may have two states (on and off) or multiple states. For example, a microwave may have multiple states, including, standby, on, activation of the rotatable table, energizing of the magnetron, and off.

In comparison, if the signature data is not matched with a stored signature data, the signature data may be sent to the management system 220 for additional analysis. As will be appreciated, the management system 220 may comprise additional compute capacity as well as additional data storage of additional signature data of other devices. For example, the management system may maintain a device signature data store 227 that includes signature data for a large variety of devices, device types, and/or device states.

Signature data that are maintained in the device signature data store 227 may be generated or obtained from a variety of sources. For example, device manufacturers may provide device signature data for devices and/or device states of devices. In other implementations, as devices and/or device states are identified at different locations, those device signature data may be aggregated, combined, or added to the device signature data store and used in determining other devices and/or device states at other locations. For example, there may be some signature variation between multiple instances of the same type of device or the same device state of multiple devices of the same device type. As the devices and/or device states are determined at locations, the range of that variation may be updated and used in detecting other instances of that device and/or device state. Accordingly, as additional devices, device states, and/or instances of devices/device states are identified at different locations, those signatures may be included in the signature data store 227, thereby increasing the management system's 220 ability to identify devices/device states at different locations and to determine if those devices are operating within an expected range, as indicated by the device signature data detected for the device or a device state of that device.

When the management system 220 receives signature data, it may first compare the signature data with device type signatures to determine a device type (e.g., refrigerator, television, toaster, heater) of the device that generated the signature data. Upon determining a device type, the management system may then compare the signature data with signature data of that device type to determine a match having a highest similarity with the signature data, thereby determining the device and/or the device state of the device. In some implementations, upon determination of the device, device type, and/or device state, the management system may send to the communication hub at the location, and/or to the plug-in energy sensor, an identification of the newly identified device, device type, and/or device state along with the corresponding signature data. Such information may be added to the stored signature data at the location and/or added to the location profile data store 228 that is maintained by the management system 220.

In some implementations, additional information from other devices at the location may also be utilized by the communication hub 204 and/or the management system 220 to determine the device. For example, information received from one or more connected devices may be used to limit or identify candidate devices that are known to be operating and/or to remove from consideration devices that are known to not be operating. Likewise, sensors at the location may be used to assist in device determination. For example, a light or motion sensor may provide data indicating whether a person is moving in areas of the location and/or whether lights are on/off within areas of the location. As another example, image data and/or other information, such as device identification of a device in the possession of a person, may be used to identify a person at the location. Such information may be used to expand or reduce the list of candidate devices that may be operating and generating the detected signal.

In addition to determining a device and/or the device state of the device, the management system 220 may also receive from a power system 250, such as a power company, energy consumption information for the location 200, which the management system may maintain in the usage pattern data store 226 for the location. The management system may then determine energy consumption by devices operating at the location by combining the received energy consumption information with the operation information or device state information for devices at the location. For example, the energy consumption information, may be utilized to determine an increase in energy consumption at the location between the start time and the stop time corresponding to signature data detected at the location. This increase in energy consumption between the start time and stop time is indicative of the energy consumed by the device that generated the signature data.

In some implementations, energy consumption data may be obtained at the location, for example, from a power meter or service meter at the location. For example, a power meter may include a wireless transmitter and may be configured to provide energy consumption data on a periodic and/or responsive basis. While this information may be generally collected for and by the power company, the information may also be collected by the plug-in energy sensor and/or the communication hub 204 and used to determine the change in energy consumption between the start time and stop time for the identified device.

User acknowledgement or approval may be obtained before energy consumption information and/or information from other devices is collected and used with the described implementations. Likewise, in implementations, user acknowledgement or approval may be obtained before any data is transmitted from the location to the remote system and/or before any transmitted data is aggregated or used in detecting devices at other locations.

As discussed further below, based on the device/device type, time of operation, and amount of energy consumed by operation of the device, one or more energy saving actions and/or recommendations may be made for the location and/or the device. For example, the management system 220 may determine if there is another time at which the device may be operated at a lower cost (e.g., night when the cost of energy from the power company is lower). As another example, the management system 220 may determine if the identified device is operating as expected and/or a potential return on investment if the identified device was replaced with another device of the same device type (e.g., a more energy efficient device). Based on these additional analysis, one or more recommendations may be made to operate the device at different times and/or replace the device with a different model.

In some implementations, third party systems 231 may also provide data, such as weather data, device data, expected energy consumption for devices, device signature data, etc., to the management system 220. Third party systems include any type of system or service that is independent of the location that provides data that may be used by the management system 220 to determine energy saving actions that may be performed by one or more devices at the location. For example, the third-party system 231 may be a device manufacturer that provides expected energy consumption information for devices and/or signature data for devices. In such an example, the management system 220 may utilize the expected energy consumption information for a device to determine if that specific device is operating as expected and/or whether replacement of an existing device with a different device of the same device type will save energy. Likewise, the signature data for the device may be used to detect operation of the device at a location, as discussed herein.

The power system 250 may also communicate with the management system 220 and provide, for example, energy consumption information for the location, demanded power information, or load on the power system, forecasted power demands, costs per unit of power under different operational constraints, etc. For example, the power system 250 may provide information to the management system indicating which power stations are currently operating, the cost per unit of energy produced, and the current load on the power station, also referred to herein as load value. Alternatively, or in addition thereto, energy consumption for a specific location may be provided by a device at the location, such as the power meter 207.

A power system 250 typically includes one or more power station(s) 250-3, transmission station(s) 250-2, and distribution station(s) 250-1. Locations, such as location 200 create demand for power provided by the power system 250 and pay for that power.

Power stations 250-3 may include any form of power generation. For example, a power station 250-3 may be a wind based power station 250-3A, such as a wind farm, a fossil-fuel based power station 250-3B, a hydroelectric power station 250-3C, a solar power station, a nuclear power station, etc. The power system 250 may include any number and type of power stations 250-3.

Electric-power generated by the power stations 250-3 is bulk transmitted at high-voltages via a series of transmission 250-2 lines and stations from the generating power stations 250-3 to distribution stations 250-1. Transmission 250-2 lines and stations when interconnected with each other create transmission networks, which are often referred to as "power grids." The United States has three major power grids, the Western Interconnection, the Eastern Interconnection and the Electric Reliability Council of Texas (ERCOT) grid, often referred to as the Western Grid, the Eastern Grid and the Texas Grid.

The distribution stations 250-1 are located near the locations 200 that create the demand for the power. The distribution stations 250-1 receive the bulk transmissions, step down the voltage and distribute the electricity to end locations 200, such as residential housing, businesses, commercial buildings, etc.

A few of the major constraints with power systems is that power within the system must run at the same frequency and, with only a few exceptions, electrical energy cannot be stored. As such, power must be generated and supplied in real-time at a rate that matches demand. If the demand for power exceeds supply, additional power stations 250-3 must be activated to fulfill the additional demand, or brownouts or blackouts may be experienced at numerous locations that rely upon that power. The distribution stations typically charge the locations for the consumption of energy as a measure of kilowatt-hours (kWh), which is a measure of energy. The rate per kWh generally varies based on the current power demand or load of the power system and/or based on the average or expected power demand on the power system. As the power demand on the power system 250 increases, the cost per unit of energy consumed by each location likewise typically increases.

The implementations described herein receive the signature data and start/stop times of operation from one or more locations, the third-party data, and data from the power system and process that data to determine energy saving actions that may be performed by devices at the one or more locations.

Figure 3:
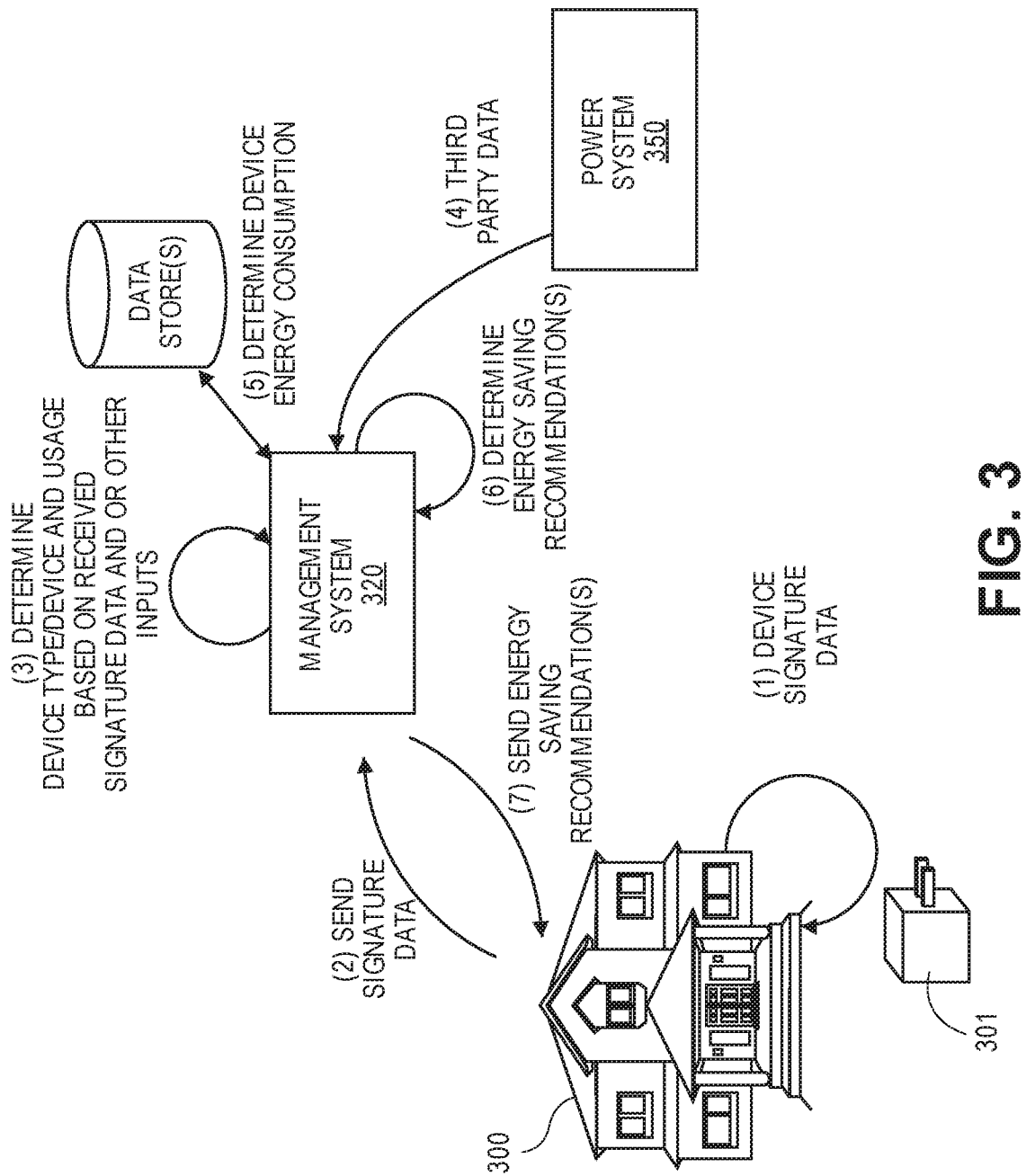
FIG. 3 illustrates an example messaging exchange as part of an energy monitoring process at a location, in accordance with described implementations.

For example, FIG. 3 illustrates an example messaging exchange as part of an energy saving process at a location 300, in accordance with described implementations. In this example, the plug-in energy sensor 301 monitors for changes in voltage at the location 300. Upon detection of a voltage change, the plug-in energy sensor 301 determines a signature data represented by the change in the voltage and a start time and stop time for operation of a device that is causing the change in the voltage at the location 300.

In this example, the start time, stop time, and signature data are sent from the location to the management system 320 for additional processing. At the management system 320, the signature data is compared with stored signature data associated with devices, device types and/or device states to determine a device type, a device, and/or a device state that matches the received signature data. For example, signature data of a microwave oven operation, as represented by voltage changes, is different than signature data of a television. In some implementations, the received signature data may be first compared to stored signature data for device types to determine a device type of the device. Once the device type is determined, additional comparisons may be performed to determine a device and/or a device state that matches the signature data. This additional comparison may be done because different devices of a device type may operate differently, have different device states, and generate different voltage signatures. For example, a microwave from manufacturer A may have a different startup state, and thus a different voltage signature for a status state, than a microwave from manufacturer B.

In addition to determining the device type, device, or device state represented by received signature data, the management system 320 also determines the amount of energy consumed during the device state of the device. For example, energy consumption information received from a power system, or other third party, may be correlated with the start time and stop time of the signature data and an increase in consumed energy determined for that period of time. That increase in consumed energy for the location during the period of time is representative of the energy consumed by the device state of the device that generated the voltage signature.

In some implementations, the device identification and the determined energy consumption from operation of the device may be utilized to determine one or more energy saving actions. As discussed, energy saving actions include but are not limited to, recommending operation of the device at a different time of day, reducing the power requirements of the device, replacing the device with another device of the device type that is more efficient, etc.

Finally, in some implementations, the one or more energy saving actions may be returned to the location 300 and presented to a user at the location and/or automatically executed. For example, a recommendation in the form of an energy saving action may be output audibly or visually at the location using a communication hub, communication component, and/or other device at the location. Alternatively, or in addition thereto, the energy saving action may be sent to a device at the location for automatic execution.

Figure 4A:
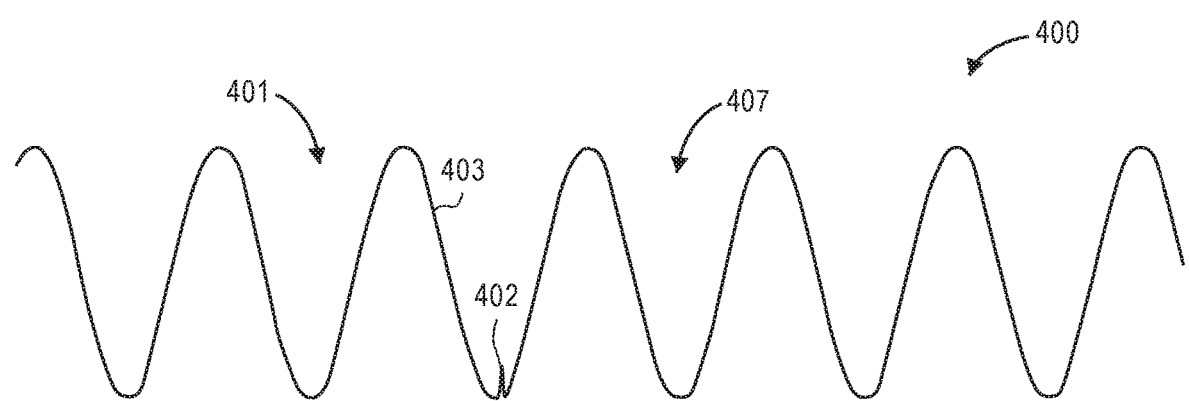
FIG. 4A illustrates an example voltage signal measurement over a period of time on the lead line of a circuit, in accordance with described implementations.
Figure 4B:
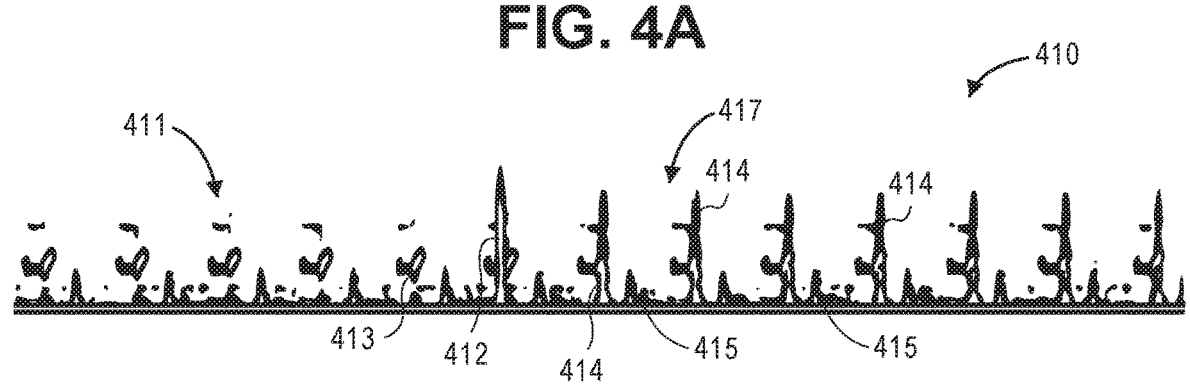
FIG. 4B illustrates an example spectrograph representation of the voltage signal of FIG. 4A, in accordance with described implementations.
Figure 4C:
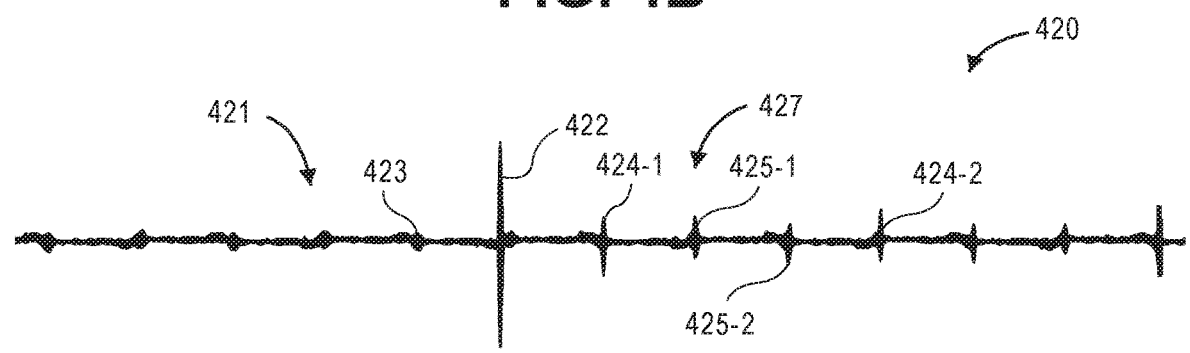
FIG. 4C illustrates an example voltage signal measurement over a period of time on the neutral line of a circuit, in accordance with described implementations.
Figure 4D:
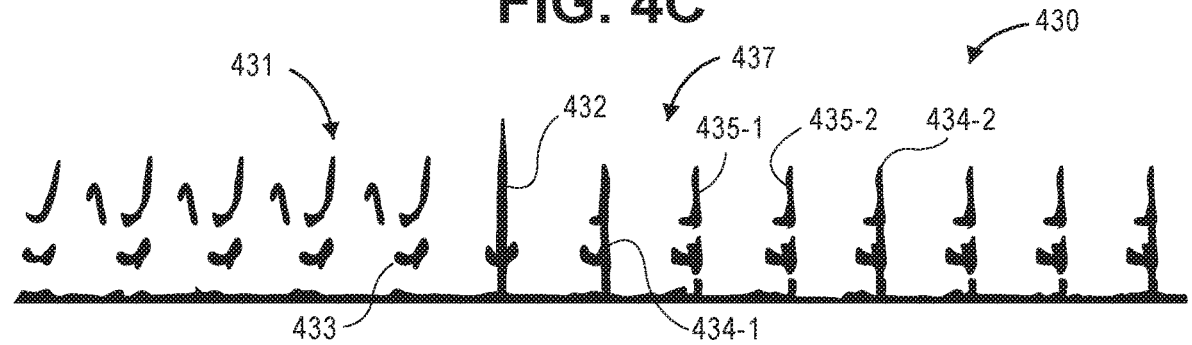
FIG. 4D illustrates an example spectrograph representation of the voltage signal of FIG. 4C, in accordance with described implementations.

FIGS. 4A through 4D illustrate example signatures that may be generated by a device during one or more device states of the device, in accordance with described implementations. In this example, FIG. 4A illustrates an example voltage signal 400 measured over a period of time on the positive, hot, or lead line (generally referred to herein as the lead line) of a circuit, in accordance with described implementations. FIG. 4B illustrates an example spectrograph representation 410 of the voltage signal of FIG. 4A, in accordance with described implementations. FIG. 4C illustrates an example voltage signal 430 measurement over a period of time on the neutral line of a circuit, in accordance with described implementations. FIG. 4D illustrates an example spectrograph 440 representation of the voltage measurement of FIG. 4C, in accordance with described implementations. As discussed further below, in some implementations, in addition to or as an alternative to measuring signals on the lead line and the neutral line, signals on the ground line may be monitored and used as an input in determining an identity of an operating device.

As can be seen in each of the signals, during an initial time 401, 411, 421, 431, there are no devices operating and the voltage in this example is 120 volts at a sixty hertz frequency as illustrated by signals 403, 413, 423, 433. When a device, in this example Device A, is activated, an initial voltage increase is introduced into the signal, as represented by the peak 402 in the signal 400, the peak 412 in the spectrograph 410, the peak 422 in the signal 420, and the peak 432 in the spectrograph 430. The device continues to operate as illustrated by the portions 407, 417, 427, and 437 following the initial peak. In addition, the periodic nature of the voltage change may be utilized as the signature data for Device A. For example, looking at the spectrograph 417 of FIG. 4B periodic large peaks 414 and following smaller peaks 415 on the lead line have a distinct pattern during device operation. In a similar manner, the signal 420 measured on the neutral line illustrates periodic voltage peaks 424-1, 425-1, 424-2, and 425-2 that are introduced by operation of Device A. In addition, the amplitude of the peaks 424-1, 424-2 are separated by a pattern of two smaller amplitude peaks 425-1, 425-2. This cycle repeats during operation of Device A, thereby providing another portion of the signature data generated by Device A during operation. Finally referring to the spectrograph of the neutral line signal, the repeating patterns of two peaks 434-1 and 434-2 are separated by smaller peaks 435-1 and 435-2. In some implementations, signals on the ground line may also be measured by the plug-in-energy sensor. For example, the ground line with respect to a floating point, such as a smooth version of voltage), may be monitored for noise or voltage introduced to the ground line during device operation. Monitoring the ground line may be particularly beneficial in detecting operation of certain electronic devices that utilize a power supply that couples the capacitor bank to the ground line using a resistor or other coupling. Likewise, ground line monitoring may aid in the determination of device malfunction as many devices, as they begin to malfunction or lose efficiency, introduce an unexpected voltage on the ground line.

The different patterns of voltage changes on the measured lead line, neutral line, and/or ground line, as detected by the plug-in energy sensor, collectively provide signature data that is representative of an operation of Device A. As discussed herein, as the signature data is detected, the signature data can be compared to stored signature data to identify Device A.

In addition to monitoring for signals indicating device operation, in some implementations, the plug-in energy sensors may actively model or determine the topology or characteristics of the electrical circuit at the location to which they are connected. By modeling the electrical circuit, the plug-in energy sensor or the remote management system may determine a baseline signal of the circuit at the location, determine behavior and responses to different loads when introduced to the circuit, etc. Such information increases the fidelity and accuracy of signal extraction and device detection.

Figure 5:
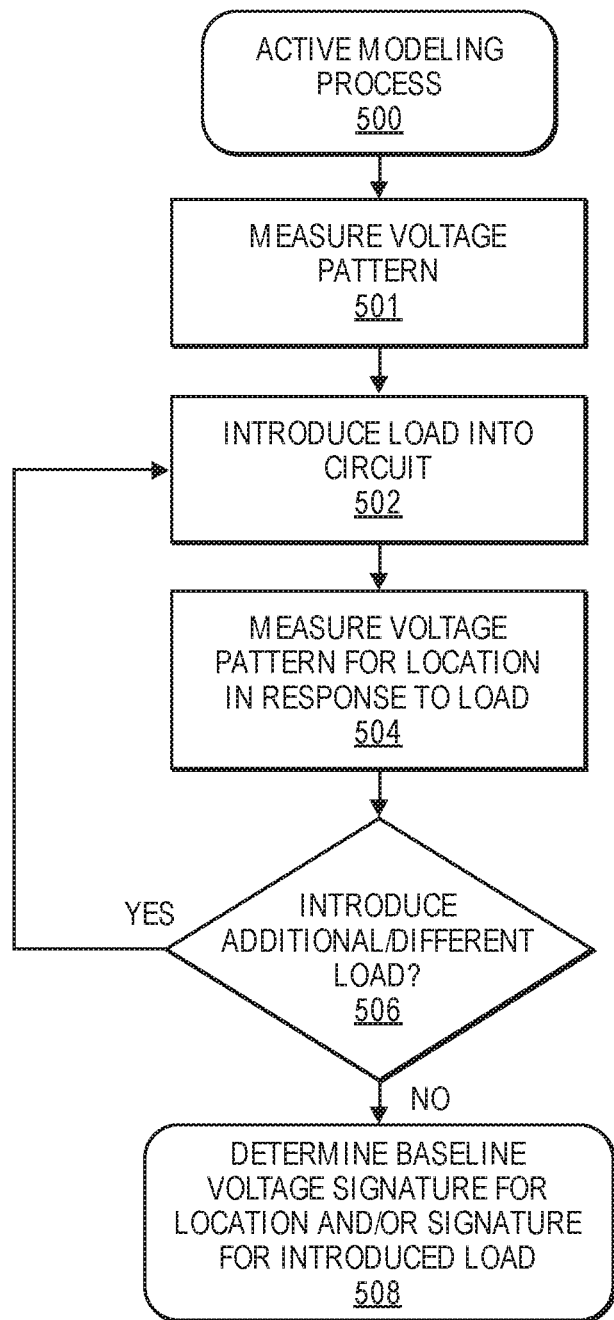
FIG. 5 is an example active modeling process, in accordance with described implementations.

FIG. 5 is an example active modeling process 500, in accordance with described implementations. The example process 500 may be performed when the plug-in energy sensor is first connected to a circuit, when power is detected by the plug-in energy sensor (e.g., after a power outage at the location), at periodic intervals, etc.

The example process 500 begins by the plug-in energy sensor measuring a voltage pattern present on the electrical circuit to which it is connected, as in 501. As discussed above, the voltage pattern may be measured on any one or more of the lead line, neutral line, and/or ground line.

In addition to measuring the voltage pattern, the example process 500 introduces a load into the circuit to which the plug-in energy sensor is connected, as in 502. Different loads may be introduced at different times to measure the differences of those introduced loads—i.e., the signals produced on the electrical circuit in response to the different introduced loads. As discussed further below, in some implementations, in addition to introducing a load to determine baseline characteristics, introduced loads will produce different measured signals based on what other devices are currently operating. For example, an introduced load will produce a different signal when a washing machine is in a spin cycle compared to when the washing machine if turned off. Introduced loads may be, for example but not limitation, resistive loads, inductive loads, capacitive loads, etc.

As the load is introduced into the circuit, the voltage pattern at the location is measured between the time the load is in introduced until introduction of the load terminates, as in 504. The duration of load introduction may be any time interval, such as 3 seconds. As discussed, the voltage pattern may be measured on one or more of the lead line, neutral line, and/or ground line and each of those measurements may be used alone or in combination to produce a signal representative of the introduced load produced on the electrical circuit under the current operating conditions of devices on the electrical circuit.

After measuring the voltage pattern produced in response to the introduced load, a determination is made as to whether an additional and/or different load is to be introduced into the circuit by the plug-in energy sensor, as in 506. In some implementations, multiple different loads may be introduced in parallel or in series by the plug-in energy sensor so that the different responses to the different types of loads can be measured.

If it is determined that an additional and/or different load is to be introduced, the example process 500 returns to block 502 and continues. However, if it is determined that no additional and/or different loads are to be introduced, a baseline voltage signature data is determined for the location and/or a signature data representative of the introduced load at the location and under the current conditions is determined, as in 508. The baseline voltage may be determined by subtracting out each of the measured signals resulting from the different introduced loads and the remaining signals identified as the baseline signal. This may be done for one or more of the lead line, neutral line, and/or ground line and the baseline signature data may be considered to include one or more of those signatures. Likewise, the signature data for the introduced load may be determined by removing the voltage pattern measured at block 501 before the load was introduced, and producing signature data from the remaining voltage pattern that was produced in response to the introduction of the load into the electrical circuit.

In some implementations, the example process 500 may be performed at different times when it is known that different devices are operating at the location so that different signature data produced in response to an introduced load can be determined and associated with those devices and/or particular device states of those devices. For example, a resistive load may be periodically introduced into the electrical circuit and the resultant signature data determined at different times when different devices are known to be in different operating states. The resultant signature data may then be associated with those devices and/or device states. At a later time, when device detection is being performed, the resistive load may be introduced into the electrical circuit and the resultant signature data compared to load signature data determined under different device operating conditions/states. Those comparisons may be used as inputs in device identification and detection and/or determination of device state.

As discussed above, in some implementations, more than one plug-in energy sensor at a location may be beneficial at monitoring and determining device operation at the location. In such instances, it may be beneficial to have the different plug-in energy sensors connected to the electrical circuit at the location on different phases of the circuit and/or on different branches of the circuit. Such positioning may be done when a second, or additional plug-in energy sensor is connected to a circuit at a location that already includes at least one plug-in energy sensor.

Figure 6A:
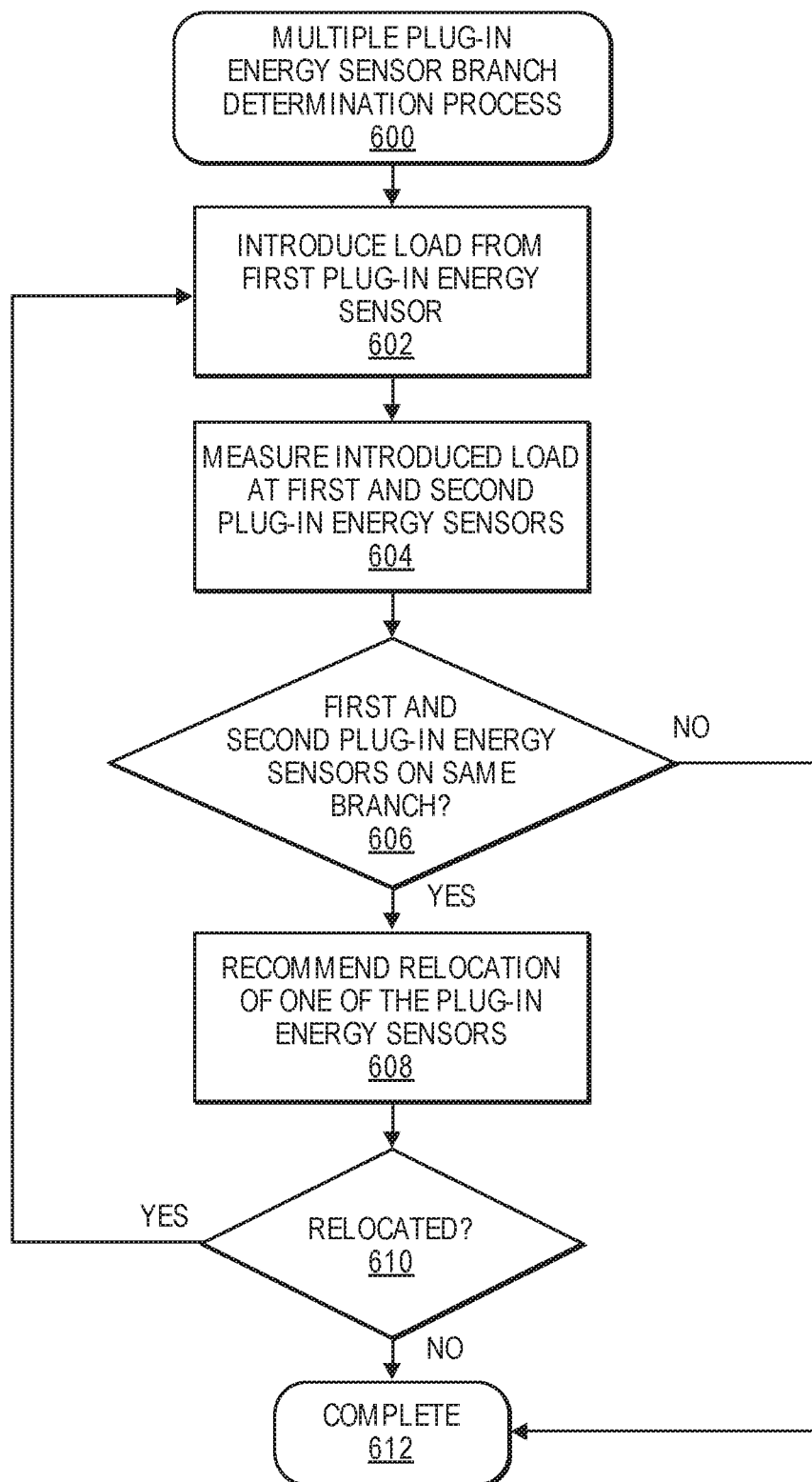
FIG. 6A is an example multiple plug-in energy sensor branch determination process, in accordance with described implementations.

FIG. 6A is an example multiple plug-in energy sensor positioning process 600, in accordance with described implementations. The example process 600 begins with a first plug-in energy sensor introducing a load into the circuit, as in 602. For example, the first plug-in energy sensor may introduce, via a prong of the first plug-in energy sensor that is inserted into an electrical outlet of the electrical circuit, a load. As discussed above, the load may be any of a resistive load, an inductive load, a capacitive load, etc.

As the load is introduced into the circuit, the voltage pattern on the circuit is measured by the first plug-in energy sensor and the second plug-in energy sensor, as in 604. For example, the load may be introduced for a defined period of time (e.g., five seconds) and each plug-in energy sensor may measure the voltage patterns as detected through respective electrical prongs coupled to the electrical circuit when inserted into electrical outlets. In some implementations, the two voltage patterns may be processed, as discussed herein, to produce signature data of the introduced load, as measured by each of the first plug-in energy sensor and the second plug-in energy sensor.

Those two measurements or signature data may then be compared to determine a difference between the voltage patterns as measured by each of the first plug-in energy sensor and the second plug-in energy sensor. Based on the difference between the measured voltage pattern by the first plug-in energy sensor and the measured voltage pattern by the second plug-in energy sensor, a determination is made as to whether the first plug-in energy sensor and the second plug-in energy sensor are on the same branch of the circuit, as in 606. For example, if there is no or limited attenuation or impedance changes (below a threshold amount) between the two voltage patterns, it may be determined that the two plug-in energy sensors are on the same branch of the circuit. In comparison, if there is a measurable (e.g., above a threshold amount) attenuation or impedance change between the two voltage patterns, it may be determined that the two plug-in energy sensors are on different branches of the circuit.

If it is determined that the first plug-in energy sensor and the second plug-in energy sensor are on the same branch, a recommendation may be sent to a user at the location to relocate either the first plug-in energy sensor or the second plug-in energy sensor to a different electrical outlet at the location, as in 608. For example, an audible communication may be output via a communication hub/communication component at the location, requesting that one of the plug-in energy sensors be relocated, if convenient. In other implementations, the output may be part of a setup process that is presented to the user during a setup or installation of a plug-in energy sensors.

A determination may then be made as to whether one of the plug-in energy sensors has been relocated to a different electrical outlet at the location, as in 610. Relocation may be determined by, for example, a determined removal of the plug-in energy sensor from the circuit and then a reconnection of that plug-in energy sensor to the circuit. Determination may be made by the other plug-in energy sensor measuring voltage patterns on the circuit, by a communication component at the location determining that the plug-in energy sensor has become unavailable (e.g., unplugged) and then become available (plugged-in), detection of an activation or unique code (discussed below) that is transmitted by the plug-in energy sensor when plugged into the circuit, etc.

If it is determined that the plug-in energy sensor has been relocated, the example process 610 returns to block 602 and continues. If it is determined that one of the plug-in energy sensors has not been relocated the example process completes, as in 612. Determining that a plug-in energy sensor has not been relocated may be based on a defined period of time (e.g., 10 minutes) elapsing without detecting a change or movement of the plug-in energy sensor.

Figure 6B:
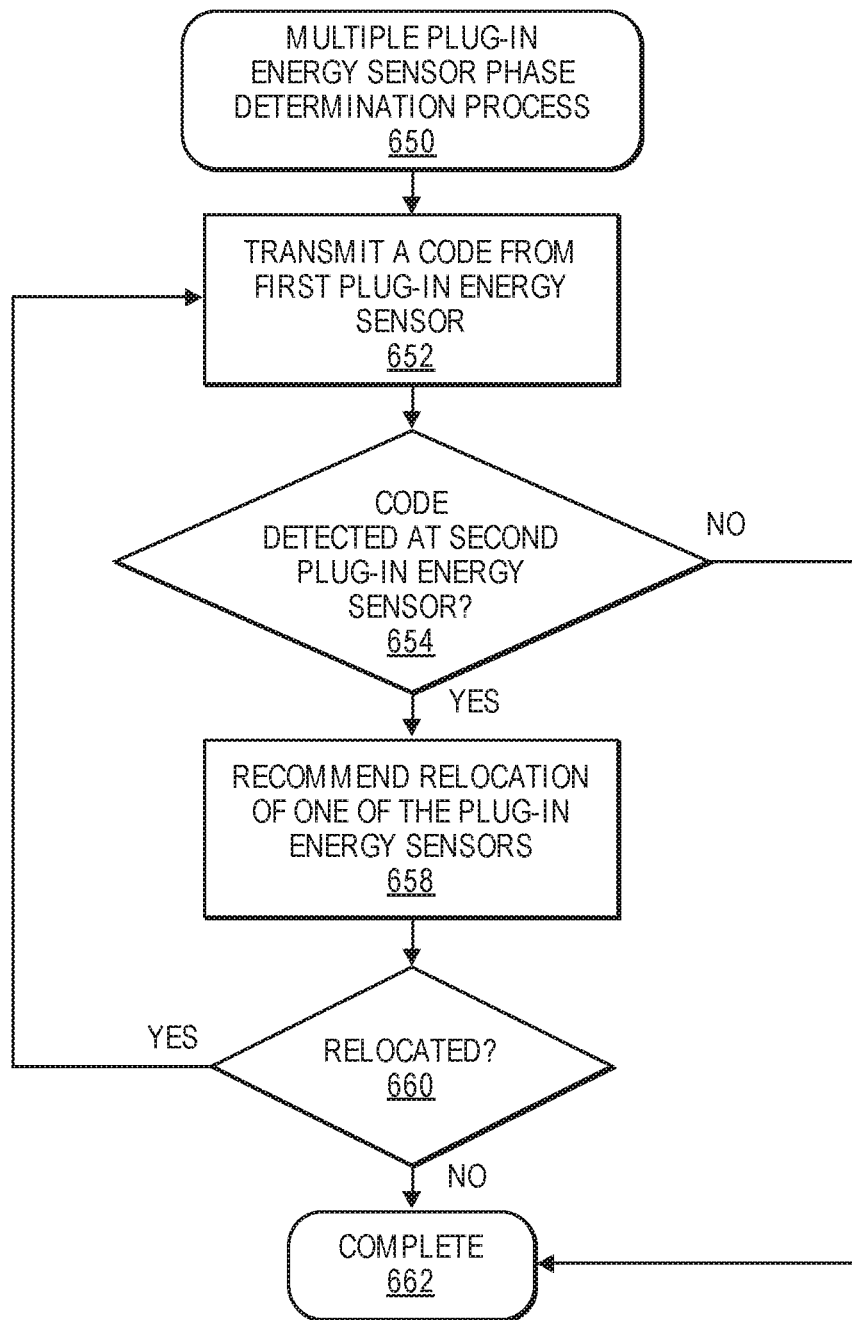
FIG. 6B is an example multiple plug-in energy sensor phase determination process, in accordance with described implementations.

FIG. 6B is an example of another multiple plug-in energy sensor positioning process 650, in accordance with described implementations. The example process 650 begins with a first plug-in energy sensor transmitting a code, as in 652. For example, the first plug-in energy sensor may transmit a code or unique identifier for a defined period of time (e.g., 10 seconds) when plugged into the electrical outlet of the circuit, in response to receiving power from the circuit. The code may be transmitted via the electrical circuit and/or through another communication channel, such as a wireless network at the location. The code may be a unique identifier that identifies the plug-in energy sensor, a defined code that is detectable by other plug-in energy sensors if transmitted via the electrical circuit (which may or may not be unique to a plug-in energy sensor in particular), and/or may include phase or timing information determined by the plug-in energy sensor to indicate a phase of the circuit to which the plug-in energy sensor is connected.

As the code is transmitted, a determination is made at the second plug-in energy sensor as to whether it receives or detects the code, as in 654. If the code is transmitted via the wireless network at the location, it may be received by the other plug-in energy sensor and/or by the communication component at the location and a determination made as to the phase on which the plug-in energy sensor is operating. If the code is transmitted on the electrical circuit, it will only be received by the second plug-in energy sensor if both plug-in energy sensors are connected to the same phase of the circuit.

If the code is not detected or it is determined from the code that the two plug-in energy sensors are operating on different phases, the example process 650 completes, as in 662. However, if the code is detected by the second plug-in energy sensor and/or it is determined from the code that the two plug-in energy sensors are operating on the same phase of the two-phase circuit, a recommendation may be sent to a user at the location to relocate either the first plug-in energy sensor or the second plug-in energy sensor to a different electrical outlet at the location, as in 658. For example, an audible communication may be output via a communication hub/communication component at the location, requesting that one of the plug-in energy sensors be relocated, if convenient. In other implementations, the output may be part of a setup process that is presented to the user during a setup or installation of a plug-in energy sensors.

A determination may then be made as to whether one of the plug-in energy sensors has been relocated to a different electrical outlet at the location, as in 660. Relocation may be determined by, for example, a determined removal of the plug-in energy sensor from the circuit and then a reconnection of that plug-in energy sensor to the circuit. Determination may be made by the other plug-in energy sensor measuring voltage patterns on the circuit, by a communication component at the location determining that the plug-in energy sensor has become unavailable (e.g., unplugged) and then become available (plugged-in), detection of an activation or unique code (discussed below) that is transmitted by the plug-in energy sensor when plugged into the circuit, etc.

If it is determined that the plug-in energy sensor has been relocated, the example process 660 returns to block 652 and continues. If it is determined that one of the plug-in energy sensors has not been relocated, the example process completes, as in 662. Determining that a plug-in energy sensor has not been relocated may be based on a defined period of time (e.g., 10 minutes) elapsing without detecting a change or movement of the plug-in energy sensor.

In some implementations, movement or re-positioning of plug-in energy sensors, as discussed with respect to FIGS. 6A and 6B, may not be convenient or available as an option. For example, if a first plug-in energy sensor is included in a power supply of a microwave and a second plug-in energy sensor is included in a power supply of a refrigerator, it may not be convenient to relocate either of those plug-in energy sensors. In such an instance, both plug-in energy sensors may operate on the same phase and/or branch of the circuit. Alternatively, one of the plug-in energy sensors may be identified as the primary and perform monitoring, while the second plug-in energy sensors is deactivated.

Figure 7:
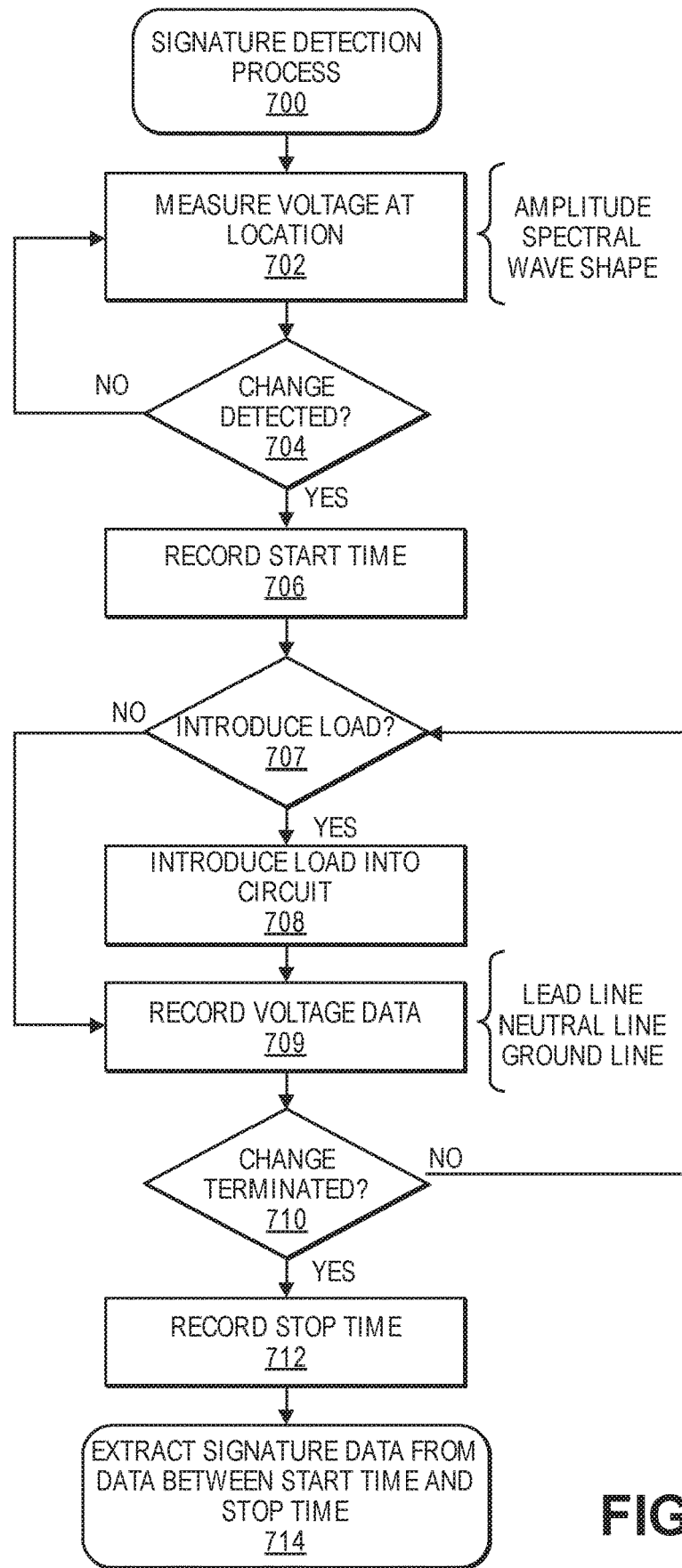
FIG. 7 illustrates an example signature detection process, in accordance with described implementations.

FIG. 7 illustrates an example signature data detection process 700, in accordance with described implementations. The example process begins by monitoring for a voltage change at a location, as in 702. As discussed above, a known or baseline voltage signature data (e.g., 120 V at 60 Hz) may be known for a location and monitored for deviations over a period of time. A variety of techniques may be utilized to determine voltage changes including, but not limited to, monitoring for changes in amplitude, spectral changes, and/or waveform or wave shape changes. In some implementations, the voltage changes may be monitored on a time basis to detect changes in the voltage over a period of time (e.g., comparing $T_0$ with $t_1$, etc.). Likewise, the voltage change may be monitored on any one or more of the lead line with respect to ground, the neutral line with respect to ground, or the ground line with respect to a reference, such as a smooth voltage waveform.

As the voltage at the location is monitored, a determination is made as to whether a change in the voltage is detected, as in 704. If no change is detected, the example process 700 returns to block 702 and continues. However, if a change is detected, a start time of the detected change is recorded, as in 706. A start time may be any identifier or marker indicating a time at which the voltage change at the location is detected. In some implementations, the plug-in energy sensor may be synchronized with a timing clock, such as a clock signal transmitted over a wireless network at the location. In such an example, the start time may be a time determined from the clock signal when the voltage change is detected.

In some implementations, a determination may also be made as to whether one or more loads are to be introduced into the circuit while the device is operating, as in 707. As discussed above, introducing a known load into the circuit during device operation will produce different resultant signals based on the device and/or the device state of the device, which may aid in identifying the device and/or the device state of the device. For example, a resistive load introduced into the circuit during the spin cycle of a washing machine (a device state) will produce a different resultant signal compared to introduction of the same resistive load during the fill cycle of the washing machine (another device state), or when the washing machine is off (another device state). If it is determined that a load is to be introduced into the circuit during the device operation, the load is selected and introduced into the circuit for a defined period of time (e.g., three seconds), as in 708.

During and subsequent to introduction of the load into the circuit, or if it is determined that no load is to be introduced into the circuit, voltage data from one or more of the lead line, the neutral line, and/or the ground line, is recorded, as in 709. In some implementations, all voltage data may be recorded to memory. In other implementations, the voltage data may be processed as it is received to remove the baseline voltage signature data and/or introduced load voltage signature data, such that only the signature data generated by the change in voltage due to device operation remains, and that change recorded. In still other examples, the voltage data may be periodically sampled and those samples, or the change voltage represented in those samples, recorded. For example, samples of the voltage data may be obtained once per second and introduced load signature data and/or signature data produced by the operation of the device determined from the samples.

As the voltage data is recorded, a determination is made as to whether the change in the voltage has terminated, as in 710. Determining whether the change in voltage has terminated may be done for a period of time before it is confirmed that the change has terminated. For example, some device states may generate signature data in which there is no additional voltage at periodic intervals, e.g., during the open/close of relay switches of the device, but the device is still in the same device state. By confirming that there is no voltage change for a defined period of time, e.g., five seconds, it may be confirmed whether the device has changed device states.

If it is determined that the voltage change has not terminated, the example process 700 returns to block 707 and continues. However, once the device state changes, the voltage change will terminate or change, and the transition will be detected by the example process 700. When it is determined that the voltage change has transitioned, a stop time indicating the change is recorded, as in 712.

Finally, the recorded voltage data between the start time and the stop time is processed to extract the signature data of the device and/or signature data resultant from introduced loads, as in 714. As discussed, the signature data may be extracted by subtracting out the baseline voltage signature data and this may be done on one or more of the lead line, the neutral line, or the ground line. Additionally, or as an alternative thereto, the signature data resulting from device operation or device state may be determined based on an increase in amplitude of the signal during the period of time, based on a spectral analysis of the recorded data, and/or based on wave shape or waveform analysis of the recorded data. Likewise, the signature data produced from an introduced load may be predictable based on the load that was introduced.

Figure 8:
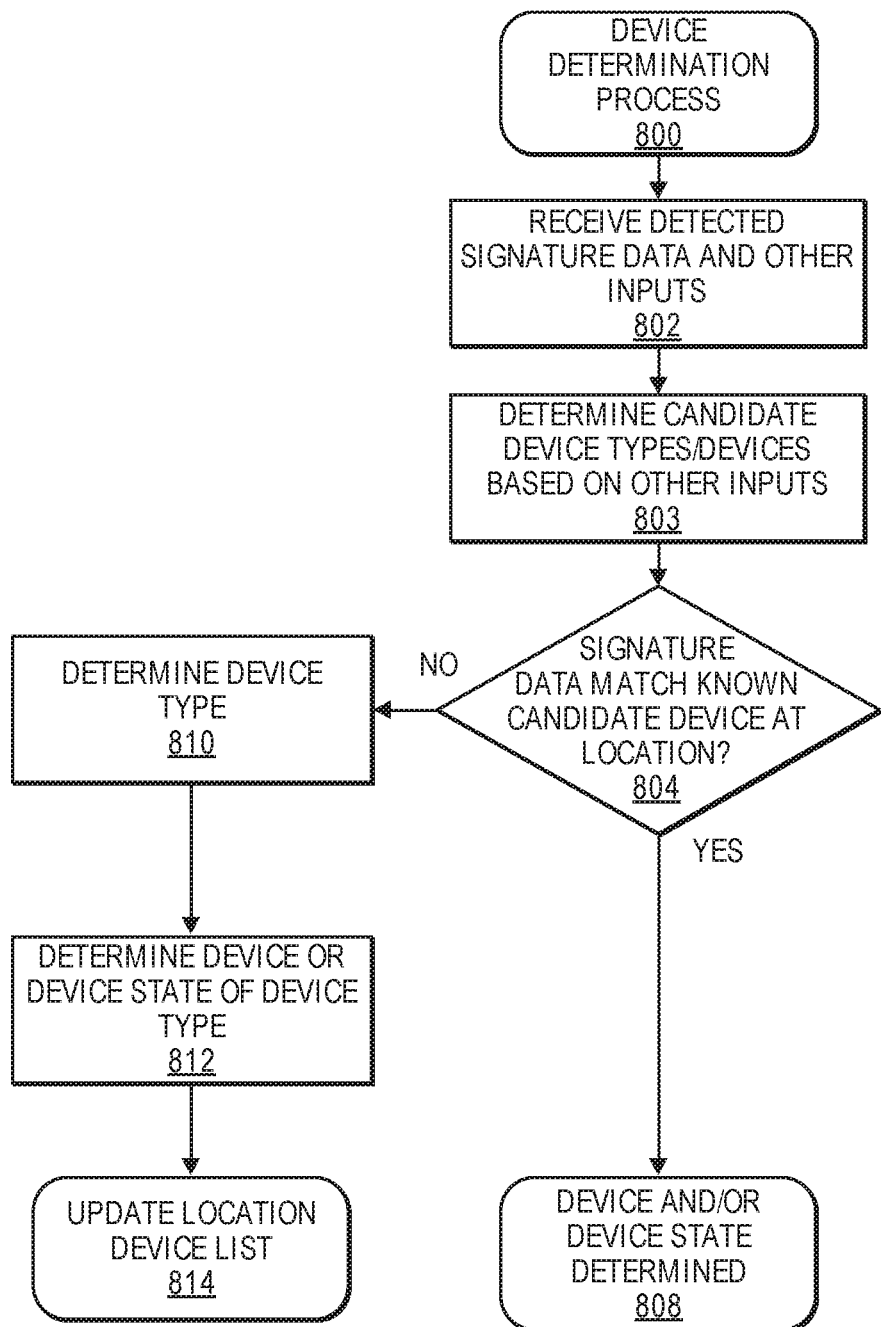
FIG. 8 illustrates an example device determination process, in accordance with described implementations.

FIG. 8 illustrates an example device determination process 800, in accordance with described implementations. The example process 800 may be performed at the plug-in energy sensor, at a communication hub or communication component at the location, at the remote management system, or portions of the example process 800 may be performed at different locations.

The example process 800 begins upon receipt of a detected signature data, and optionally, other inputs, as in 802. Other inputs may include, but are not limited to, signature data detected from one or more loads introduced into the circuit by the plug-in energy sensor and/or another plug-in energy sensor, during operation of the device, data from the operating device and/or other devices or sensors at the location, energy usage information, etc. For example, other devices at the location may provide data indicating presence of users at the location, changes in environment conditions at the location (e.g., lighting changes resulting from the on/off of a light at the location, temperature changes), etc. In still other examples, other inputs may include the time of day and predictive modeling that has been developed for the location over a period of time to predict candidate devices that may be operating and/or the device state of those devices.

If other inputs are received, those inputs may be used to determine candidate device types and/or candidate devices that may have been operating or confirmed to not be operating at the location, as in 803. As inputs are collected and associated with identified devices, those inputs may be used as data points to determine candidate device types or candidate devices for consideration in device identification and/or device state determination.

Once candidate devices are determined, the signature data is compared with signature data of those known candidate devices and/or signature data of different device states of those known candidate devices to determine if there is a match between the received signature data and signature data of a known candidate device or device state of a known candidate device at the location, as in 804. In some implementations, each time the example process 800 is performed, and a new device or device state identified for a location, the device and/or device state and corresponding signature data may be added to a location datastore that identifies devices and/or device states and corresponding signature data for the location. Then, when the example process 800 is performed in the future, it may first compare a received signature data with signature data of devices and/or device states of devices known to be at the location, thereby reducing processing time and compute requirements and increasing accuracy of device identification and/or device state determination for the location. In addition, in some implementations, the identity of the identified device and/or device state and corresponding signature data may be provided to the remote management system and added to the device signature data store for the device/device state and aggregated with signature data of other locations for use in future identification of devices and/or device states at various location.

If it is determined that the signature data matches signature data of a candidate device known to be at the location and/or a device state of a candidate device known to be at the location, the device and/or device state is determined, as in 808. However, if it is determined that the signature data does not match stored signature data of a candidate device known to be at the location and/or a device state of a candidate device known to be at the location, additional processing of the signature data is performed to determine a device type corresponding to the signature data, as in 810. Additional processing may include comparing the signature data to different signature data profiles for different device types and/or processing segments of the signature data to identify markers in the signature data that correspond with markers of different device types. For example, signatures of all brands of microwave ovens may include markers that are common or similar. For example, all brands of microwave ovens may have an initial voltage increase at power on (a device state), a second voltage increase when rotation of the turntable is activated (another device state), and a third voltage increase when the magnetron of the microwave is energized (another device state). While these voltage increases and device states may be different for different brands of microwaves, the pattern or relationship between the state changes may be similar, thereby generating markers for all brands of microwaves that may be utilized to initially classify signature data by device type (e.g., microwave).

Upon determination of the device type, the signature data may then be compared to stored signature data of devices of that device type to determine the specific device and/or device state(s) that generated the received voltage signature data, as in 812. Similar to comparing the received signature data with stored signature data of candidate devices known to be at the location and/or device states of candidate devices known to be at the location, to determine a device of the device type, the received signature data is compared with signature data of devices or devices states of devices of the device type to determine the stored signature data that has a highest similarity to the received signature data. In some implementations, a confidence level may be determined and if it cannot be determined with a high enough degree of confidence, a notification may be sent to the location that identifies the device or devices that have been determined to have similar signature data, along with a request for device confirmation. In such an example, the potential devices may be indicated to a user at the location and the user may select or specify the correct device. Once the device and/or device state has been determined, the location device list may be updated to include the device and/or device state and the signature data corresponding to that device/device state, as in 814.

As noted above, some or all of the example process 800 may be performed at the plug-in energy sensor, some or all of the example process 800 may be performed by the communication hub or the communication component, and/or some or all of the example process 800 may be performed by the remote management system. For example, the plug-in energy sensor and/or the communication hub/component may maintain, in memory, signature data for devices known to be at the location and/or device states of devices known to be at the location and may perform steps 800 through 808. However, if the signature data is not matched with signature data of a known device/device state, the signature data may be sent via a network to the management system and the management system may perform steps 810 through 814 to determine the device and/or device state represented by the signature data.

Figure 9:
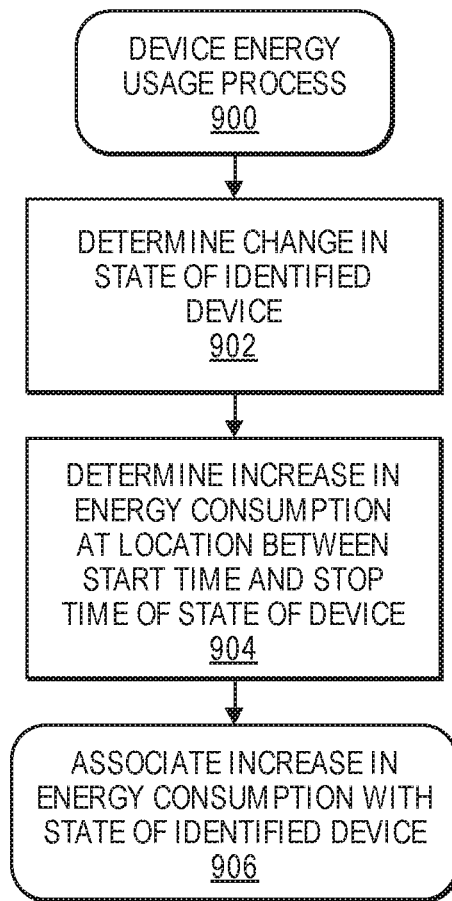
FIG. 9 illustrates an example device usage determination process, in accordance with described implementations.

FIG. 9 illustrates an example device energy usage determination process 900, in accordance with described implementations. The example process 900 begins by determining a start time and a stop time corresponding to a device state change for an identified device at the location, as in 902. As discussed above, the start time and stop time may be generated by the plug-in energy sensor based on detected changes in voltage at the location.

During a period of time between the start time and the stop time, an increase in energy consumed at the location is determined, compared to energy usage before and/or after the period of time, as in 904. For example, the power supply company may provide time based energy consumption data for the location and the example process 900 may determine a difference between the energy consumption during the period of time and the energy consumption before and/or after the period of time. The increase or difference in the energy consumption during the period of time is associated with the device as the amount of energy consumed by the device while operating during the period of time, as in 906.

In other implementations, energy consumption data may be obtained from devices at the location, such as a power meter at the location, the operating device itself, other devices, etc. For example, the power meter may wirelessly transmit energy consumption data for the location and the plug-in energy sensor and/or communication component may receive the energy consumption data and use it with the example process 900.

As discussed above, based on energy consumption determined for devices at a location, one or more energy saving actions may be performed and/or recommended. For example, it may be determined based on an expected energy consumption and an actual energy consumption that a device at the location needs to be serviced or replaced. As another example, it may be determined that a device should be replaced with a more efficient device of the same device type and/or that operation of the device should be done at a different time of day. In some implementations, the voltage pattern on the ground line may provide an indication that a device needs servicing and/or is potentially malfunctioning. For example, if a device is beginning to malfunction, it may begin introducing a voltage onto the ground line. Such an indication may be identified by the disclosed implementations as an indication of potential device malfunction.

In still other examples, based on the operation time of devices or device states of devices, one or more related devices may be identified. For example, over a period of time it may be determined that certain devices operate in parallel or at the same time as other devices. For example, lighting above a stove and/or an exhaust fan may always be turned on in conjunction with operation of the stovetop in a kitchen at the location. Upon determination of such related devices, the device state of one or more of those devices may be automatically controlled or change when the state of another related device changes. In addition, such patterns of device operation may be utilized as inputs for predictively determining candidate devices that may be operating at the location.

Figure 10A:
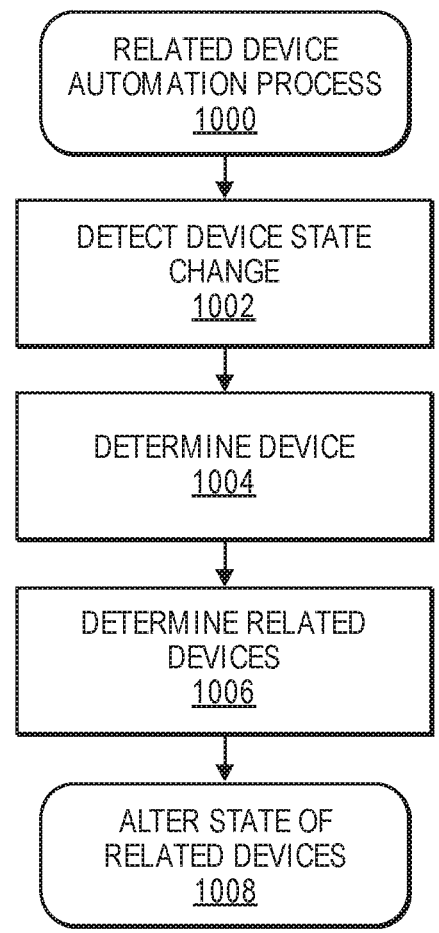
FIG. 10A illustrates an example related device automation process, in accordance with described implementations.

FIG. 10A illustrates an example related device automation process 1000, in accordance with described implementations. In this example, device signature data detected over a period of time may be identified as related if the same device signature data are consistently detected at the same or similar time, or in the same pattern of operation. Likewise, the devices and corresponding times of particular device states may be maintained and used as inputs in determining candidate devices in the future.

The example process 1000 begins upon detection of a device state change for a device, as in 1002. A state change may be detected when a voltage signature data for the device is identified, indicating that the device has been powered on, powered off, or changed between any two states of device states for the device. As another example, a state change may be detected when a voltage signature data for a device terminates, indicating that the device has been powered down or operation of the device has ceased.

Upon detection of a state change, the device that caused the state change is determined, as in 1004. Device determination may be performed using any of the implementations discussed above. In addition to determining the device for which the state change is detected, one or more related devices that are associated with the device are determined, as in 1006. Likewise, the state of those related devices when the detected device is in the current state is determined. Based on the state of the detected device and the state for each related device, the state of those related devices may be automatically updated or changed, as in 1008. By automating the state change of related devices, energy may be conserved that may otherwise be wasted if a user, for example, forgets to turn off a device when it is no longer needed. For example, lights above a stovetop may be automatically shut off (state change) a defined period of time after the state of the stovetop changes from active to inactive.

Figure 10B:
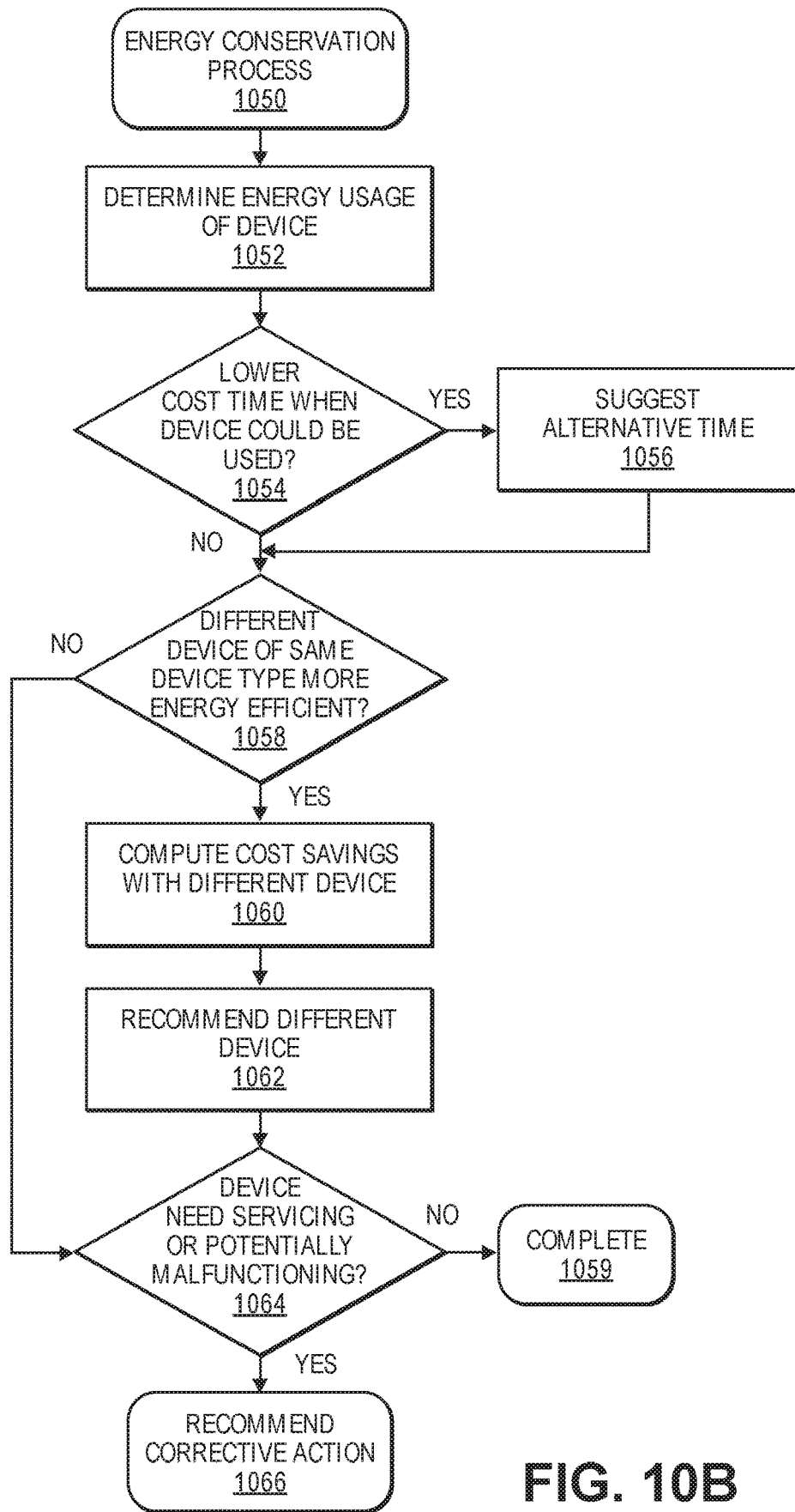
FIG. 10B illustrates an example energy conservation process, in accordance with described implementations.

FIG. 10B illustrates an example energy conservation process 1050, in accordance with described implementations. The example process 1050 begins by determining energy usage for a device at a location, as in 1052. Energy usage for a device may be determined using any of the above described implementations.

A determination may then be made as to whether there is a lower cost time when the device could be used at the location, as in 1054. In some implementations, a third party or power company may identify per unit costs for energy and there may be a difference in the cost depending on the actual or expected demands. For example, the cost of energy may be lower late at night compared to the afternoon when more devices are in use. However, user convenience may also be considered in determining whether a lower cost time is available for device operation. For example, while operation of an air conditioner may be cheaper late at night, it may be inconvenient for a user at the location to not have air conditioning during peak heat hours of the day. In comparison, operation of a dishwasher, washing machine, dryer, etc., may be optimized to different times when the cost of energy consumed is lower, without inconveniencing the user.

If it is determined that there is a lower cost time when the device may be operated, the alternative time may be suggested or implemented, as in 1056. If it is determined that there is not a lower cost time, or after suggesting or implementing a lower cost time, a determination is made as to whether a different device of a same device type is more energy efficient than the existing device, as in 1058. As discussed above, manufacturers (third parties) may provide expected energy consumption information for various devices. Utilizing that information, actual energy consumption for a device at a location may be compared to expected energy consumption for other devices of the device type to determine an energy savings that may be realized if the device were replaced. If there is no other device that is more efficient, the example process 1050 completes, as in 1059.

If there are other devices of the same device type that are more efficient, the energy consumption savings for an alternative device may then be computed as a cost savings for the location based on the time(s) of device operation, the cost of energy, device cost, and/or difference in energy that would be saved, as in 1060. Such cost savings may be represented as a return on investment and/or on-going cost savings. The cost savings and alternative device may be recommended as a replacement, as in 1062. As discussed above, the recommendation may be output to a user at the location via the communication component at the location and/or through other devices.

In some implementations, a determination may also be made as to whether the device needs servicing and/or is potentially malfunctioning, as in 1064. For example, the voltage pattern on the ground line may be monitored and if the voltage on the ground line from the device increases, such an increase may indicate a potential device malfunction. As another example, if the actual energy consumption of the device during operation exceeds an expected energy consumption threshold, it may be determined that the device is not operating at optimum efficiency for the device and needs to be serviced.

If it is determined that the device needs servicing, and/or the device is potentially malfunctioning, recommended corrective action may be provided to a user at the location, as in 1066. As discussed above, the recommended corrective action may be output to a user at the location via the communication component at the location and/or through other devices. If it is determined that the device is not in need of servicing and not potentially malfunctioning, the example process completes, as in 1059.

Figure 11:
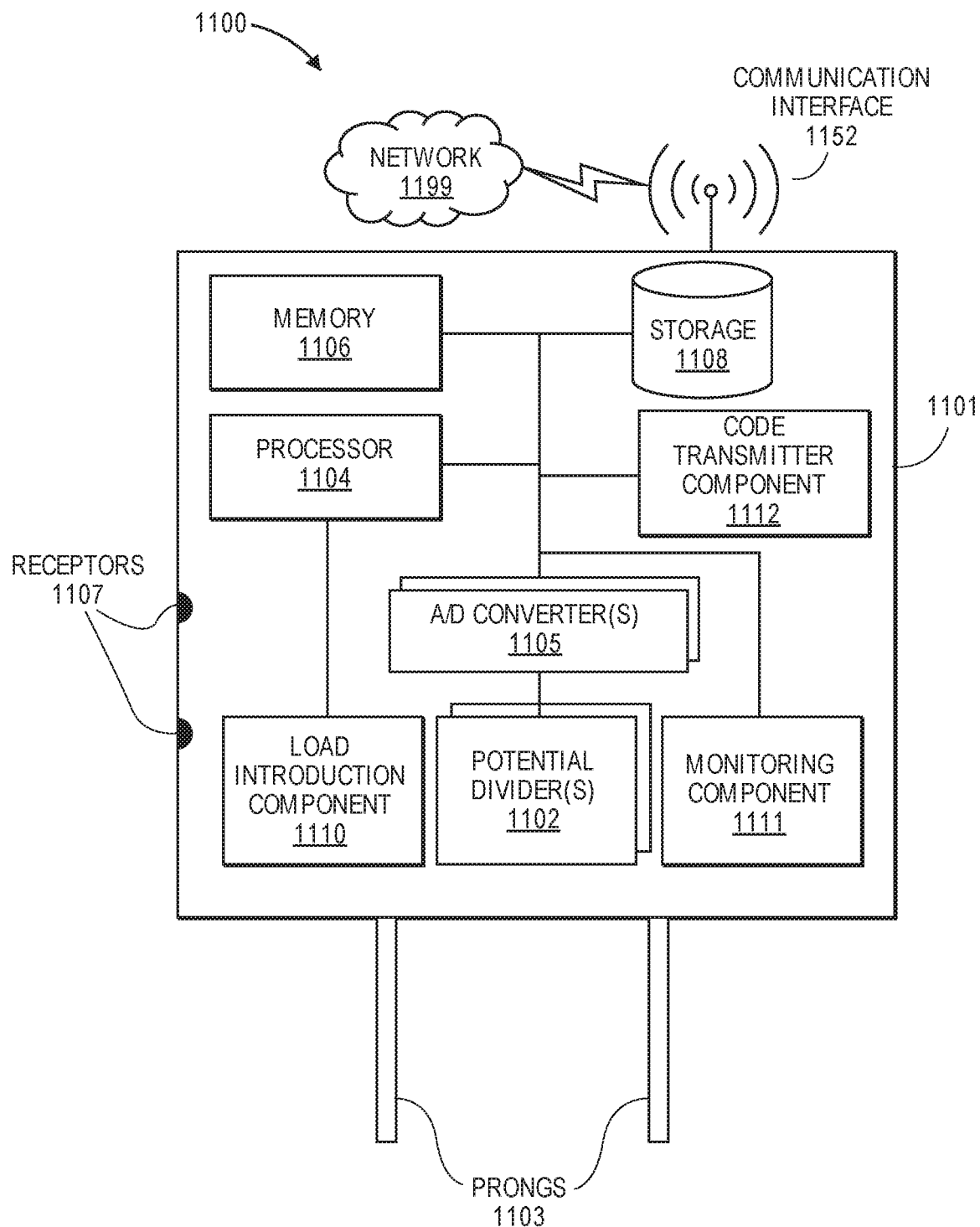
FIG. 11 illustrates example components of a plug-in energy sensor, in accordance with described implementations.

FIG. 11 illustrates example components of a plug-in energy sensor 1100, in accordance with described implementations. In implementations, the plug-in energy sensor 1100 is configured to be installed into an electrical outlet to interact with an electrical circuit at the location. As such, the plug-in energy sensor will include an insulating housing 1101, such as a plastic body or shell. In some implementations, the housing 1101 will be in the form of a cube such that the plug-in energy sensor has an appearance of a charger or other common electrical component. Protruding from the housing is at least one prong 1103. In most instances, as illustrated in FIG. 11, there are two prongs 1103 extending from the housing. In some implementations, there may be a third prong, or ground. The prongs interface with the electrical circuit at the location and enable the plug-in energy sensor to monitor voltage at the location, transmit codes, and/or introduce loads into the circuit at the location. For example, the prongs may be inserted into a common electrical outlet at the location.

Coupled to the prongs 1103 are one or more potential dividers 1102, such as voltage dividers. In some implementations there are three potential dividers, one for voltage measured from the lead line, one for voltage measured from the neutral line, and one for voltage measured from the ground line. In other implementations, there may be additional or fewer potential dividers. The potential dividers 1102 convert a high voltage, such as 120 volts, of the electrical circuit at the location into a lower voltage that can be recorded and analyzed at high frequencies (e.g., 200 kilohertz).

The one or more potential dividers may be coupled to one or more analog-to-digital converters 1105. The analog-to-digital converters receive the high frequency sampling produced by the one or more potential dividers 1102 and convert the analog signal to digital data, referred to herein as voltage data. The voltage data may be stored to memory, such as a random access memory ("RAM"), flash memory, or other form of permanent or temporary storage 1108. Any form of memory may be used with the disclosed implementations.

The prongs 1103 may also be coupled to a load introduction component 1110, a code transmitter component 1112, and/or a monitoring component 1111. The load introduction component may be operable to introduce one or more loads into the electrical circuit to which the plug-in energy sensor is coupled. For example, the load introduction component may be operable to introduce any one or more of a resistive load, an inductive load, or a capacitive load into the electrical circuit. The code transmitter component may be operable to transmit one or more codes that may be detectable by other plug-in energy sensors and/or communication components at the location to determine if two or more plug-in energy sensors are on the same phase of the electrical circuit at the location. Likewise, the monitoring component may be configured to monitor voltage patterns on the electrical circuit and/or detect codes transmitted from other plug-in energy sensors.

As discussed above, the monitoring component may include components that are configured to measure voltage patterns between the lead and ground line, the neutral and ground line, and/or the ground line and a reference point. The voltage patterns in the different lines (lead, neutral, ground) may be monitored simultaneously by different components of the monitoring component. Likewise, the monitoring component may be in communication with the processor 1104, the memory 1106, and/or the communication interface 1152.

The memory 1106 stores program instructions that are executable by the one or more processors to cause the one or more processors to perform any one or more portions of the implementations discussed herein. In addition, the memory 1106 and/or the storage 1108 may also maintain a signature data store that includes, for example, signature data of devices known to be at the location and/or device states of devices known to be at the location.

The plug-in energy sensor 1100 may also include a communication interface 1152, such as a wireless antenna, that enables the plug-in energy sensor to connect to one or more wireless networks 1199, such as a Wi-Fi network, Bluetooth network, etc., and transmit or receive information, such as detected signature data, voltage data, codes, etc.

In some implementations, the plug-in energy sensor may also include a pair of electrical prong receptors 1107 that are configured to receive electrical prongs of another device and allow alternating current to passthrough so that the electrical outlet may be utilized by another device, in addition to the plug-in energy sensor 1100. In still other implementations, the components of the plug-in energy sensor 1100 may be incorporated entirely into another device, such as a communication component, a communication hub, a device, etc.

Figure 12:
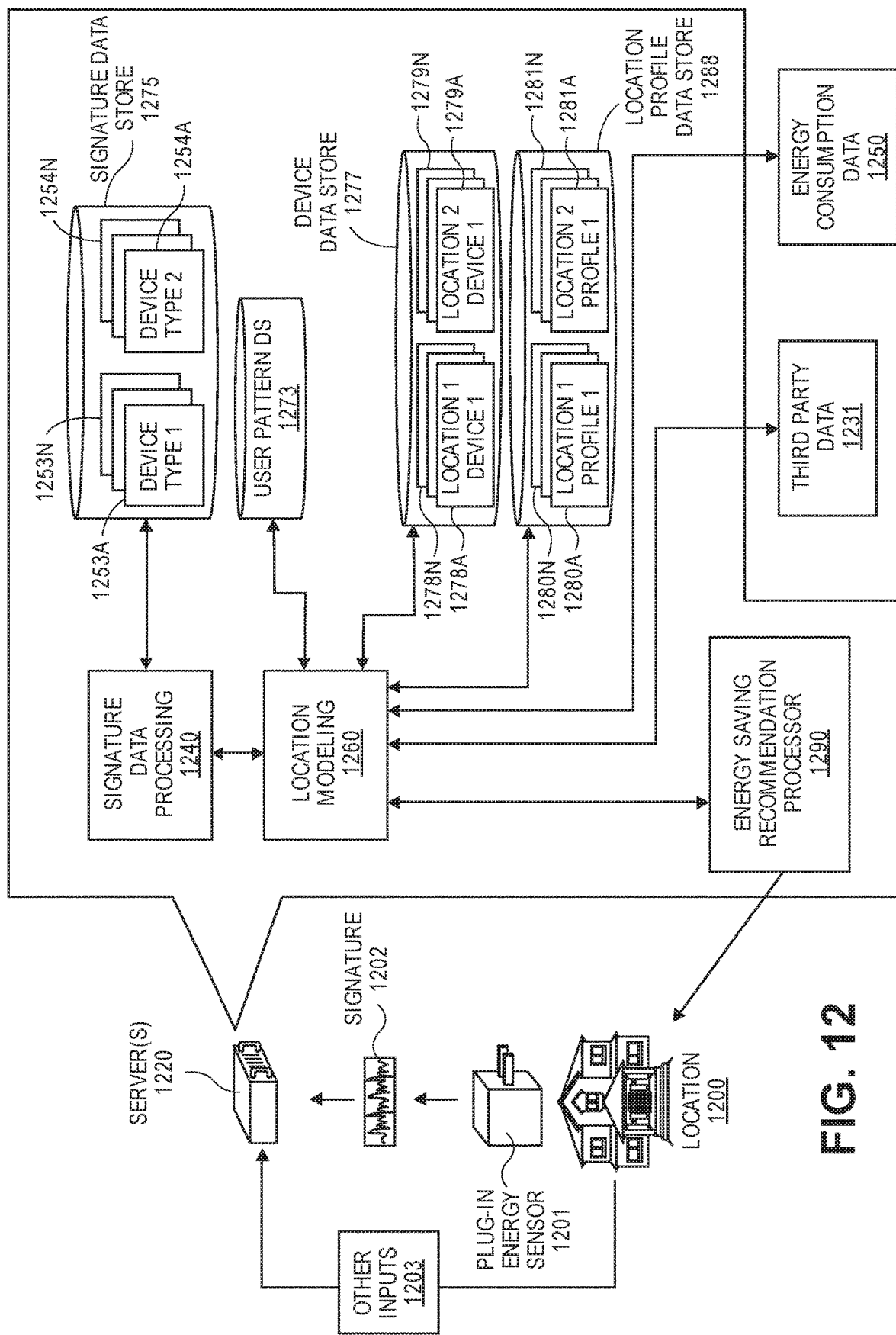
FIG. 12 illustrates example components of a management system, in accordance with described implementations.

FIG. 12 is a conceptual diagram of a server 1220 that processes voltage data/signature data 1202 and/or other inputs 1203 received from plug-in energy sensors 1201 at various locations 1200, receives third party data 1231 from third parties, energy consumption data 1250 for different locations 1200, and provides energy saving recommendations, in accordance with described implementations. The various components of the server 1220 may be located on the same or different physical devices. Communication between various components illustrated in FIG. 12 may occur directly or across a network. The server 1220 discussed with respect to this FIG. 12 may be the same or a different server than the server 1220 discussed above with respect to FIG. 12. In operation, the server 1220 may include computer-readable and computer-executable instructions that reside on the server 1220 and perform one or more of the described features or functions, also referred to herein as a management system.

The energy savings recommendation processor 1290 may function to determine and recommend one or more energy savings actions, such as operating a device at a different time of day, or replacing a device with a more energy efficient model. Upon determining one or more energy savings actions to be performed at a location, the energy savings recommendation processor 1290 may generate and send command data and/or message data to a communication component, communication hub, and/or devices at the location 1200 for presentation to a user at the location and/or for programmatic execution by the device(s) at the location 1200.

Signature data 1202, or voltage data, from one or more plug-in energy sensors 1201 at a location 1200 is transmitted in real time, near real time, or periodically to one or more remote computing resources, illustrated in this example as a server 1220. The server receives and processes the signature data 1202 or the voltage data with signature data processing 1240. Processing may include processing the voltage data to determine a signature data and/or determining a device type and/or device state that generated the signature data 1202 by comparing the signature data to stored signature data that is known to be generated by different devices, device types, and/or device states to determine differences between the stored signature data and the received or determined signature data 1202. The signature data store 1275 may maintain device type information and/or signature models, which may include markers representative of different signature data for different device types. For example, signature data of device type 1 may include multiple different markers 1253A-1253N corresponding to different voltage changes at different time intervals that are characteristic of devices of a particular device type. Likewise, signature data of device type 2 may include multiple different markers 1254A-1254N corresponding to signature data generated by devices of that device type.

The device types and/or device signature data maintained in the signature data store 1275 may be aggregated from multiple locations as devices at those locations are determined. The aggregated data may then be used to identify devices and/or device states of devices at other locations and, as those devices/device states are identified, the device signature data at those locations added to the data store. As such, the signature data store 1275 will continue to expand and include device signature data for more and more devices and/or device states of devices.

In some implementations, rather than voltage data or signature data 1202 being sent from the location 1200 to the servers 1220, the plug-in energy sensor 1201, a communication hub at the location, or a communication component at the location may process the signature data to determine a device, device type, and/or device state of a device at the location that generated the signature data. A device identifier of the determined device and/or device state, a start time and a stop time corresponding to the signature data may then be sent to the servers 1220 for additional processing.

As signature data is collected and devices and/or device states determined, the information, including the device and/or device state identifiers, signature data, times of operation, etc., may be aggregated with other signature data generated by other devices at the location 1200 to develop a location profile 1280, that is stored in a location profile data store 1288, using a location modeling component 1260. The location profile 1280 may include device identifiers and/or signature data for devices and/or device states of devices known or determined to be at the location 1200, any operational relationships between devices and/or device states, signature data of those devices and/or device states, predicted times when those devices will be operating in different device states, etc. In addition, in some implementations, the location profile 1280 may also maintain expected and/or actual energy consumption information for detected devices. For example, received third party data 1231 may include expected energy consumption information for different device models. The location modeling component 1260 may also receive energy consumption data 1250 and utilize that information to determine actual energy consumption for devices at the location. As discussed above, the changes in actual energy consumption at different periods of time may be combined with start times and stop times of determined device operation at the location 1200 to determine the amount of energy actually consumed by devices at the location during operation.

As location profiles 1180 are developed for different locations, those profiles may be stored in a location profile data store 1288. In some implementations, different location profiles may be generated for a location based on, for example, the day of the week, the number of people at the location, etc. Over time, multiple location profiles may be created for each location and maintained in the location profile data store 1288. For example, location 1 may include multiple location profiles 1280A-1280N generated at different points in time for that location. Likewise, location 2 may include multiple location profiles 1281A-1281N generated at different points in time for that location. Every location may include one or more location profiles that are stored in the location profile data store 1288. The location profiles, which may be associated with different periods of time during the year, may be used to predict device states and times during which devices are in high demand/high use or low demand/low use.

In some implementations, in addition to determining energy saving actions and expected energy savings, the location profiles may be used to determine efficiency losses of a device or problems (e.g., mechanical or electrical) with the device. For example, if an expected energy consumption for a device at a location is different than the actual energy consumption for that device under the same or similar conditions, such a difference may be indicative of problems with the device.

In some implementations, signature data and/or voltage data may likewise be used to determine user profiles and/or usage patterns corresponding to the location 1200. For example, signature data and/or voltage data, may be used to determine the presence or absence of users at the location and/or at particular areas within the location. As users typically follow a patterned behavior, over time, the signature data may be used to determine those user patterns and such information may be stored in the user pattern data store 1273. For example, signature data from device operation of devices at the location may be aggregated over a period of time (e.g., thirty days) to determine that on Monday, Tuesday, Wednesday, Thursday, and Friday, a user at the location generally enters the kitchen within the structure between 05:00 hours and 05:30 hours, moves to a second room between 06:30 hours and 07:30 hours and then departs the location until approximately 18:00 hours. Such information may be maintained in the user profile for the user.

In some implementations, a device data store 1277 may also be maintained. The device data store 1277 may include information regarding devices at each location. For example, the device data store may maintain device information 1278A-1278N for each of multiple different devices at a first location, maintain device information 1279A-1279N for each of multiple different devices at a second location, etc.

Device information may include, among other information, signature data generated by different device states of the device, the manufacturer of the device, the make, model, and year of manufacture, the power rating of the device, the efficiency of the device, etc. In some implementations, data received from a same type of device operating at different locations may be compared to determine consistency among devices and/or to detect potential device problems or abnormalities. For example, if there are fifty microwaves of Brand A and forty-nine of them have similar power demands but the fiftieth one has a higher power demand, it may be determined that the fiftieth microwave is potentially malfunctioning.

In response to receiving signature data from the server 1220 (FIG. 12), or when it is otherwise determined that one or more energy saving actions or recommendations are to be determined for a location, the location modeling component 1260 obtains current sensor data, third party data 1231, such as expected device energy consumption, actual energy consumption data 1250 for a location, location profile and/or user profile data and utilizes that information to determine one or more energy saving actions or recommendations for the location. For example, one or more modeling algorithms may receive the various inputs and determine one or more energy saving actions for a relevant period of time that will produce the highest energy savings from the location with the least inconvenience or negative impact on the user. For example, if the energy saving action is to be performed on a Saturday between 12:00 hours and 14:00 hours it may be determined that the most effective energy saving action may be to shut off the hot water heater during that time. Such an action may substantially reduce the power demand from the location and be of limited interference to the user at the location because the location profile, user profile, and/or usage patterns indicate that hot water from the hot water tank is rarely used during that time period.

Upon determining by the location modeling component 1260 one or more energy saving actions, the energy savings recommendation processor 1290 may generate command data that includes instructions that cause one or more devices to programmatically alter operation in accordance with the energy savings action and/or generate message data that includes a recommendation that is output to a user at the location to recommend that the user manually alter an operation of one or more devices at the location in accordance with the energy saving actions. The command data and/or message data may then be sent to a communication component, communication hub, and/or directly to devices at the location 1200, as discussed above.

Figure 13:
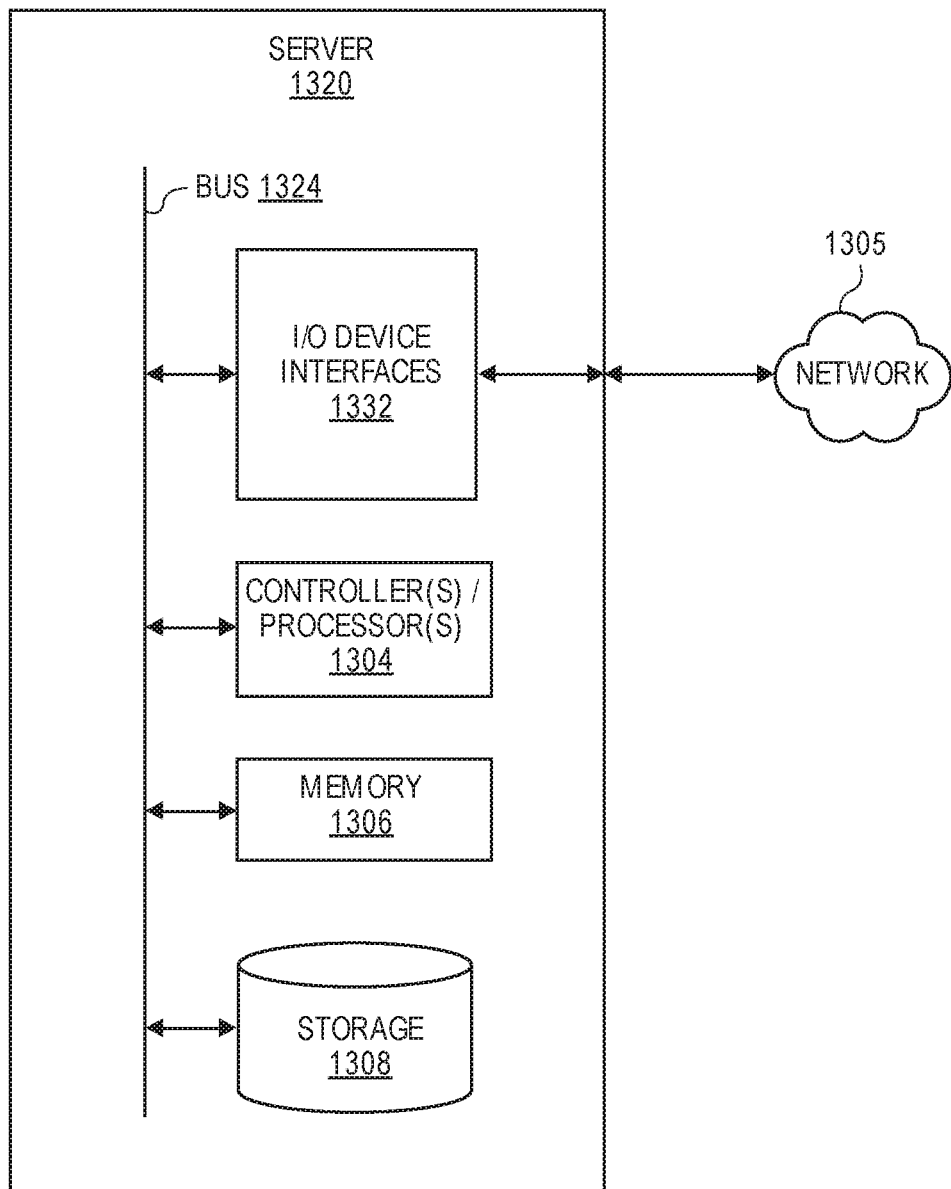
FIG. 13 illustrates example components of a server, in accordance with described implementations.

FIG. 13 is a block diagram conceptually illustrating example components of a remote device, such as a remote server 1320 that may assist with command processing and/or operation of the management system. In operation, the server 1320 may include computer-readable and computer-executable instructions that reside on the server 1320, as will be discussed further below.

The server 1320 may include one or more controllers/processors 1304, that may include a central processing unit (CPU) for processing data and computer-readable instructions, and a memory 1306 for storing data and instructions of the respective device. The memories 1306 may individually include volatile random access memory (RAM), non-volatile read only memory (ROM), non-volatile magnetoresistive (MRAM) and/or other types of memory. The server 1320 may also include a data storage component 1308, for storing data and controller/processor-executable instructions. The data storage component 1308 may include one or more non-volatile storage types such as magnetic storage, optical storage, solid-state storage, etc. The server 1320 may also be connected to removable or external non-volatile memory and/or storage (such as a removable memory card, memory key drive, networked storage, etc.) through an input/output device interface 1332.

Computer instructions for operating the server 1320 and its various components may be executed by the controller(s)/processor(s) 1304, using the memory 1306 as temporary "working" storage at runtime. The server's 1320 computer instructions may be stored in a non-transitory manner in non-volatile memory 1306, storage 1308, or an external device(s). Alternatively, some or all of the executable instructions may be embedded in hardware or firmware on the respective device in addition to or instead of software.

The server 1320 may also include input/output device interfaces 1332. A variety of components may be connected through the input/output device interfaces. Additionally, the server 1320 may include an address/data bus 1324 for conveying data among components of the server 1320. Each component within the server 1320 may also be directly connected to other components in addition to (or instead of) being connected to other components across the bus 1324.

The server 1320 may wirelessly communicate with and receive signature data and/or voltage data from locations and/or provide instructions to devices within the location and/or receive data from the devices. Any form of wired and/or wireless communication may be utilized to facilitate communication between the server 1320, plug-in energy sensors, communication hubs, communication components, and/or devices. For example, any one or more of 802.15.4 (ZIGBEE), 802.11 (WI-FI), 802.16 (WiMAX), BLUETOOTH, Z-WAVE, near field communication ("NFC"), etc., may be used to communicate between the server 1320 and one or more plug-in energy sensors, communication components, communication hubs, and/or devices.

The above aspects of the present disclosure are meant to be illustrative. They were chosen to explain the principles and application of the disclosure and are not intended to be exhaustive or to limit the disclosure. Many modifications and variations of the disclosed aspects may be apparent to those of skill in the art. Persons having ordinary skill in the field of computers, communications, energy management, and speech processing should recognize that components and process steps described herein may be interchangeable with other components or steps, or combinations of components or steps, and still achieve the benefits and advantages of the present disclosure. Moreover, it should be apparent to one skilled in the art that the disclosure may be practiced without some or all of the specific details and steps disclosed herein.

Aspects of the disclosed system may be implemented as a computer method or as an article of manufacture such as a memory device or non-transitory computer readable storage medium. The computer readable storage medium may be readable by a computer and may comprise instructions for causing a computer or other device to perform processes described in the present disclosure. The computer readable storage media may be implemented by a volatile computer memory, non-volatile computer memory, hard drive, solid-state memory, flash drive, removable disk and/or other media. In addition, components of one or more of the components and engines may be implemented in firmware or hardware.

Unless otherwise explicitly stated, articles such as "a" or "an" should generally be interpreted to include one or more described items. Accordingly, phrases such as "a device configured to" are intended to include one or more recited devices. Such one or more recited devices can also be collectively configured to carry out the stated recitations. For example, "a processor configured to carry out recitations A, B and C" can include a first processor configured to carry out recitation A working in conjunction with a second processor configured to carry out recitations B and C.

Language of degree used herein, such as the terms "about," "approximately," "generally," "nearly" or "substantially" as used herein, represent a value, amount, or characteristic close to the stated value, amount, or characteristic that still performs a desired function or achieves a desired result. For example, the terms "about," "approximately," "generally," "nearly" or "substantially" may refer to an amount that is within less than 10% of, within less than 5% of, within less than 1% of, within less than 0.1% of, and within less than 0.01% of the stated amount.

Although the invention has been described and illustrated with respect to illustrative implementations thereof, the foregoing and various other additions and omissions may be made therein and thereto without departing from the spirit and scope of the present disclosure.

What is claimed is:

1. A system, comprising:
   a plug-in energy sensor, including:
      an electrical prong insertable into an electrical outlet of an electrical circuit at a location;
      a communication component;
      a first processor; and
      a first memory coupled to the first processor and storing first program instructions that, when executed by the first processor cause the first processor to at least:
         process voltage data received via the electrical prong;
         detect a change in a voltage represented by the voltage data;
         in response to the change, introduce, by the plug-in energy sensor, a load voltage into the electrical circuit;
         while the load voltage is introduced into the electrical circuit, generate signature data representative of the change in the voltage over a period of time; and
         send, via the communication component, at least the signature data; and
   a remote computing system, including:
      a second processor; and
      a second memory storing second program instructions that, when executed by the second processor cause the second processor to at least:
         receive the signature data;

compare the signature data to a plurality of stored signature data to determine a device type associated with the signature data; and determine, based at least in part on the signature data, an amount of energy consumed by the device type during the period of time.

2. The system of claim 1, wherein the second program instructions, that when executed by the second processor further cause the second processor to at least:

receive, from a third party, energy consumption data for the location over a second period of time, wherein the second period of time includes at least the period of time;

determine, by subtracting a first energy usage prior to the period of time from the energy consumption data, an increase in energy usage at the location during the period of time; and wherein the amount of energy consumed is representative of the increase in energy usage at the location during the period of time.

3. The system of claim 1, the plug-in energy sensor further including:

at least one potential divider; and at least one analog-to-digital converter paired with the at least one potential divider, wherein the analog-to-digital converter generates the voltage data that is processed by the first processor.

4. The system of claim 1, wherein the second program instructions, when executed by the second processor further cause the second processor to at least:

compare the amount of energy consumed with an expected amount of energy for the device type;

determine, based at least in part on the comparison, that the device type at the location is consuming more than the expected amount of energy; and send notification data indicating that the device type at the location is consuming more than the expected amount of energy.

5. The system of claim 1, wherein the second program instructions that, when executed by the second processor, further cause the second processor to at least:

determine a first cost of energy during the period of time; and determine that a second cost of energy during the alternative time is lower than the first cost of energy.

6. The system of claim 1, wherein the second program instructions, when executed by the second processor, further cause the second processor to at least:

determine an alternative time that is different than the period of time during which the device type could be operated at the location at a lower cost; and cause the device type to be operated at the location during the alternative time.

7. A method, comprising:

measuring, with a plug-in energy sensor that is plugged into an electrical outlet of an electrical circuit at a location, a voltage on the electrical circuit;

determining, with the plug-in energy sensor and based on information collected from at least one of a lead line, a neutral line, or a ground line of the electrical circuit, a difference in the measured voltage at a start time, the difference being between a first value of the voltage prior to the start time and a second value of the voltage at the start time;

in response to determining the difference:

introducing, with the plug-in energy sensor, a load voltage into the electrical circuit; and while the load voltage is introduced into the electrical circuit, storing voltage data until a stop time at which the difference is no longer detected by the plug-in energy sensor;

generating signature data from the stored voltage data; and determining, based at least in part on the signature data, a device type of a device operating at the location between the start time and the stop time.

8. The method of claim 7, wherein generating the signature data includes:

generating signature data representative of a device state of the device between the start time and the stop time.

9. The method of claim 7, further comprising:

determining a difference in an amplitude of a frequency of the voltage.

10. The method of claim 7, wherein the signature data is a representative of an operation of the device.

11. The method of claim 7, wherein determining the device type includes:

analyzing the signature data with a stored signature data, the stored signature data representative of the device type.

12. The method of claim 11, further comprising:

subsequent to determining the device type, further comparing the signature data with second stored signature data, the second stored signature data representative of at least one of: the device of the device type, or a device state of the device of the device type.

13. The method of claim 12, further comprising:

associating at least one of the device type, the device, or the device state with the location; and updating a location profile maintained in a data store based at least in part on the device type, the device, or the device state.

14. The method of claim 7, further comprising:

determining, based at least in part on the first value and the second value, an increase in an amount of energy consumed by the device at the location between the start time and the stop time.

15. The method of claim 7, wherein measuring the voltage at the location further includes:

measuring a voltage potential between at least one of the lead line and a ground, the neutral line and the ground, or the ground and a reference.

16. The method of claim 7, further comprising:

determining an alternative time that is different than a time between the start time and the stop time during which the device type could be operated at a lower cost; and suggesting that the device type be operated at the location during the alternative time.

17. The method of claim 7, wherein generating signature data further includes:

extracting from the stored voltage data, at least one of a load voltage signature data or a baseline voltage signature data.

18. An apparatus, comprising:

a housing;

an electrical prong;

a potential divider that converts a first voltage received via the electrical prong when the electrical prong is inserted into an electrical outlet at a location to a second voltage, wherein the second voltage is lower than the first voltage;

at least one analog-to-digital converter that converts the second voltage to voltage data;

at least one processor; and a memory coupled to the at least one processor, the memory storing program instructions that when executed by the at least one processor cause the at least one processor to at least:

cause, by the apparatus, a load voltage to be introduced into the electrical circuit such that the load voltage is included in the second voltage that is converted to voltage data;

while the load voltage is introduced, determine signature data represented in the voltage data;

determine, based at least in part on the signature data, a start time corresponding to the signature data and a stop time corresponding to the signature data; and determine, based at least in part on the signature data, a device type of a device operating at the location between the start time and the stop time.

19. The apparatus of claim 18, wherein the signature data is representative of a device state of the device and is generated as a result of the device operating in the device state.

20. The apparatus of claim 18, wherein the program instructions that when executed by the at least one processor further cause the at least one processor to at least:

compare the signature data with stored signature representative of the device at the location; and determine, based at least in part on the comparison, that the device is operating in a first state at the location.

21. The apparatus of claim 20, wherein the program instructions that when executed by the at least one processor further cause the at least one processor to at least:

measure the first voltage via the electrical prong to determine a state change of the device from the first state to a second state.

22. The apparatus of claim 18, further comprising:

an electrical prong receptacle configured to receive a second electrical prong of a second electrical device at the location.

23. The apparatus of claim 18, wherein the signature data is determined at least in part by removing a baseline voltage signal from the voltage data.

24. The apparatus of claim 18, wherein the program instructions, when executed by the at least one processor, further cause the at least one processor to at least:

determine an alternative time that is different than a time between the start time and the stop time during which the device type could be operated at a lower cost compared to a cost to operate the device during the time between the start time and the stop time; and cause the device type to be operated at the location during the alternative time.

25. An apparatus, comprising:

a housing;

an electrical prong; and a memory coupled to the at least one processor, the memory storing program instructions that when executed by the at least one processor cause the at least one processor to at least:

detect, based at least in part on information collected from at least one of a lead line, a neutral line, or a ground line of an electrical circuit at a location when the electrical prong is connected to the electrical circuit, a change in a voltage of the electrical circuit;

in response to detection of the change:

cause a load voltage to be introduced into the electrical circuit; and while the load voltage is introduced into the electrical circuit, store voltage data until the change is no longer detected; and cause a device type of a device operating at the location to be determined based at least in part on the stored voltage data.

26. The apparatus of claim 25, wherein the program instructions that when executed by the one or more processors to cause the device type of the device operating at the location to be determined, further include instructions that, when executed by the one or more processors, further cause the one or more processors to at least:

send at least one of the voltage data or a signature data generated based at least in part on the voltage data to a remote computing system.

* * * * *